(12) United States Patent
Cibula et al.

(10) Patent No.: US 10,761,116 B2
(45) Date of Patent: Sep. 1, 2020

(54) SENSING AND CONTROL OF POSITION OF AN ELECTRICAL DISCHARGE

(71) Applicant: KW Associates LLC, Albany, OR (US)

(72) Inventors: Matthew A. Cibula, Salem, OR (US); Joshua R. Motley, Corvallis, OR (US); C. Rigel Woodside, Corvallis, OR (US); Paul E. King, Albany, OR (US)

(73) Assignee: KW ASSOCIATES LLC, Albany, OR (US)

( * ) Notice: Subject to any disclaimer, the term of this patent is extended or adjusted under 35 U.S.C. 154(b) by 106 days.

(21) Appl. No.: 16/209,943

(22) Filed: Dec. 4, 2018

(65) Prior Publication Data

US 2019/0219615 A1 Jul. 18, 2019

Related U.S. Application Data

(60) Provisional application No. 62/649,570, filed on Mar. 28, 2018, provisional application No. 62/617,036, filed on Jan. 12, 2018.

(51) Int. Cl.
| | |
|---|---|
| *G01R 15/20* | (2006.01) |
| *G01R 33/06* | (2006.01) |
| *G01R 35/00* | (2006.01) |
| *C21C 5/52* | (2006.01) |
| *G01R 31/50* | (2020.01) |

(Continued)

(52) U.S. Cl.
CPC ............ *G01R 15/20* (2013.01); *C21C 5/5211* (2013.01); *F27B 3/085* (2013.01); *F27B 3/28* (2013.01); *F27D 7/06* (2013.01); *F27D 11/10* (2013.01); *G01R 31/50* (2020.01); *G01R 33/06* (2013.01); *G01R 35/005* (2013.01); *C21C 2005/5288* (2013.01); *F27D 2007/066* (2013.01)

(58) Field of Classification Search
CPC ... G01V 3/18; G01V 1/52; G01V 3/34; G01V 3/38; G01V 5/04; E21B 47/00; E21B 4/02; E21B 7/062
USPC ................ 324/346, 333, 334, 338, 339, 536
See application file for complete search history.

(56) References Cited

U.S. PATENT DOCUMENTS

| | | | |
|---|---|---|---|
| 2,727,936 A | 12/1955 | Boyer | |
| 2,727,937 A | 12/1955 | Boyer | |

(Continued)

FOREIGN PATENT DOCUMENTS

| | | |
|---|---|---|
| JP | S60-077939 | 5/1985 |
| JP | H03-274382 | 12/1991 |

OTHER PUBLICATIONS

International Search Report dated Apr. 23, 2019 in counterpart App No. PCT/US2018/063950.

(Continued)

*Primary Examiner* — Giovanni Astacio-Oquendo

(74) *Attorney, Agent, or Firm* — David S. Alavi

(57) ABSTRACT

Sensors measure magnetic field components, and the measured fields are used to calculate and estimated transverse position of a longitudinal electric current flowing as an electric discharge across a discharge gap. Based on the estimated position, and according to a selected transverse trajectory or distribution of the estimated discharge position, magnetic fields are applied transversely across the discharge gap so as to control or alter the estimated discharge position. Inventive apparatus and methods can be employed, inter alia, during operation of a vacuum arc furnace.

32 Claims, 11 Drawing Sheets

(51) Int. Cl.
 - *F27B 3/08* (2006.01)
 - *F27B 3/28* (2006.01)
 - *F27D 7/06* (2006.01)
 - *F27D 11/10* (2006.01)

(56) References Cited

U.S. PATENT DOCUMENTS

| | | | |
|---|---|---|---|
| 2,951,890 A | | 9/1960 | Yeomans et al. |
| 2,972,695 A | | 2/1961 | Wroe |
| 2,978,525 A | | 4/1961 | Gruber et al. |
| 3,398,229 A | | 8/1968 | De Corso |
| 3,546,348 A | | 12/1970 | De Corso |
| 3,566,143 A | * | 2/1971 | Paine .................. G05F 1/67 307/126 |
| 3,609,522 A | * | 9/1971 | Hutchins ............. G01V 3/105 324/334 |
| 3,628,948 A | | 12/1971 | Bruning |
| 3,629,694 A | * | 12/1971 | Hearn ................... G01R 33/26 324/304 |
| 3,680,163 A | | 8/1972 | De Corso |
| 3,708,279 A | | 1/1973 | De Corso |
| 4,122,292 A | | 10/1978 | Karinsky |
| 4,495,625 A | | 1/1985 | Heberlein et al. |
| 4,581,745 A | | 4/1986 | Mathews et al. |
| 4,762,165 A | | 8/1988 | Ogino et al. |
| 5,373,529 A | | 12/1994 | Zanner et al. |
| 8,111,059 B1 | | 2/2012 | King et al. |
| 2018/0088164 A1 | | 3/2018 | Cibula et al. |

OTHER PUBLICATIONS

Co-owned U.S. Appl. No. 15/715,018 entitled "Estimation of arc location in three dimensions" filed Sep. 25, 2017 in the names of Cibula et al.

Ward et al; Ensemble Arc Motion & Solidification During the Vacuum Arc Remelting of a Nickel-based Superalloy; Int'l Symp on Liquid Metal Processing & Casting; p. 49 (2005).

Zanner et al; On the Origin of Defects in VAR Ingots; International Symposium on Liquid Metal Processing and Casting, Santa Fe, NM, USA, p. 13 (2005).

Zanner et al; Observations of melt rate as a function of . . . during vacuum consumable arc remelting of . . . ; Metallurgical & Materials Transactions B v15 p. 117 (1984).

Woodside; Investigating arc behavior in a DC vacuum arc remelting furnace using magnetic flux density measurements; masters thesis, Oregon State University; (2008).

Woodside; Arc Distribution and Motion During the Vacuum Arc Remelting Process as Detected with a Magnetostatic Approach; PhD dissertation, Oregon State University (2010).

Woodside et al; A Measurement System for Determining the Positions of Arcs During Vacuum Arc Remelting; IEEE Int'l Instrumentation & Measurement Tech Conf; p. 452 (2010).

Woodside et al: Characterizing Arc Motion and Distribution During Vacuum Arc Remelting; nt'l Symp on Liquid Metal Processing & Casting; v75 (2009).

Woodside et al; Arc Distribution During the Vacuum Arc Remelting of Ti—6Al—4V; Metallurgical & Materials Transactions B v44 n1 p. 154 (2012).

\* cited by examiner

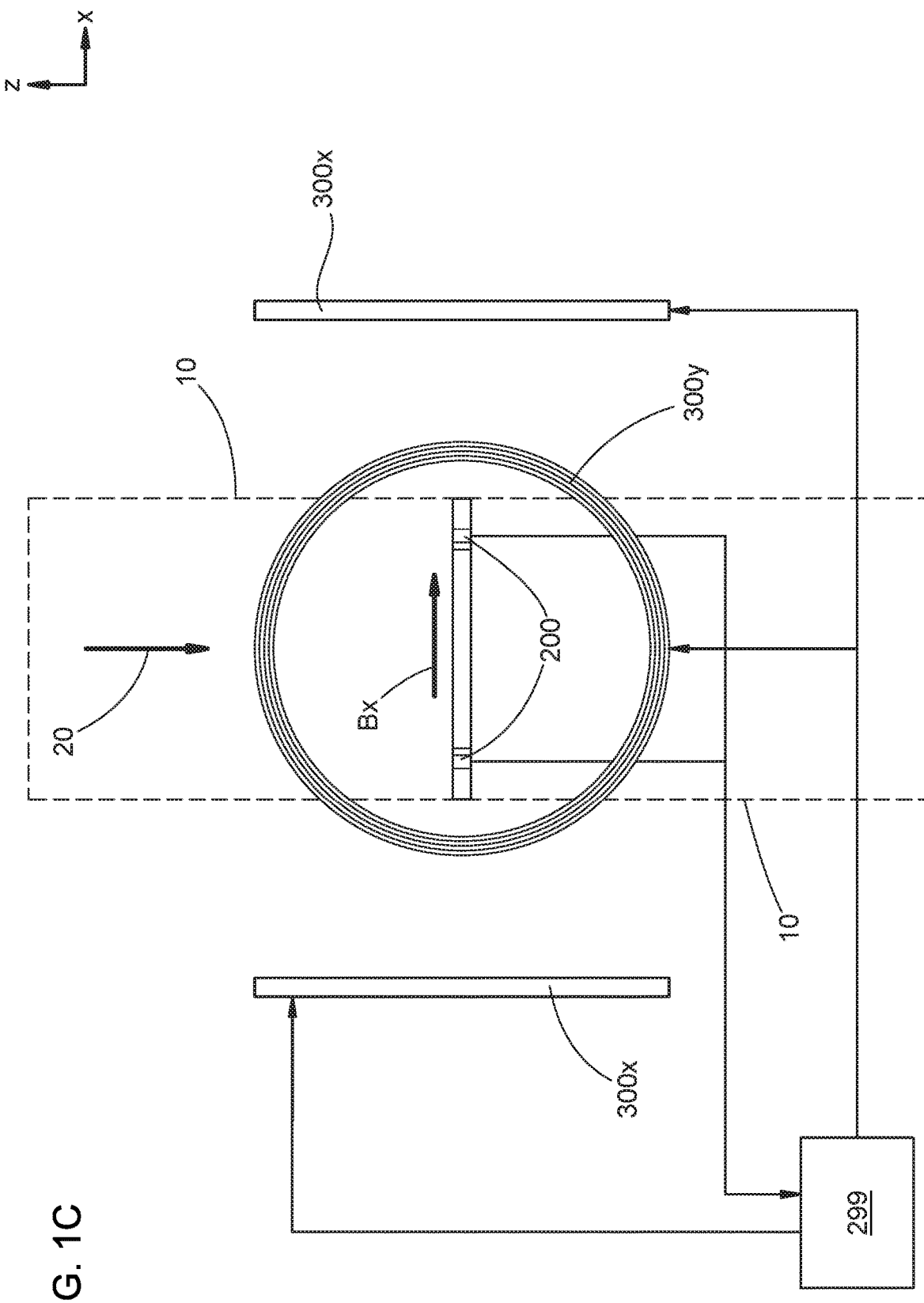

X Coil Off
X Coil On
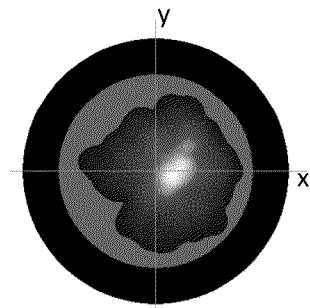
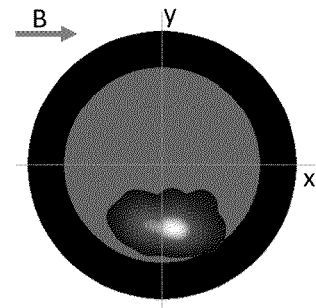
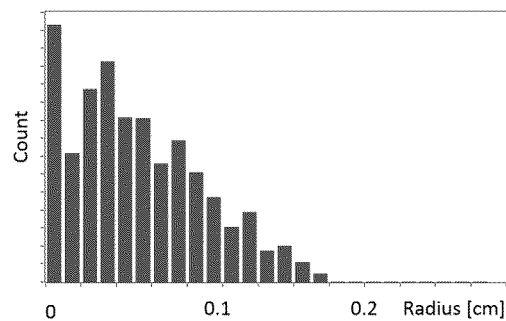
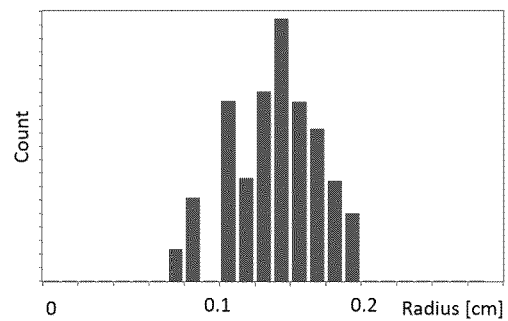
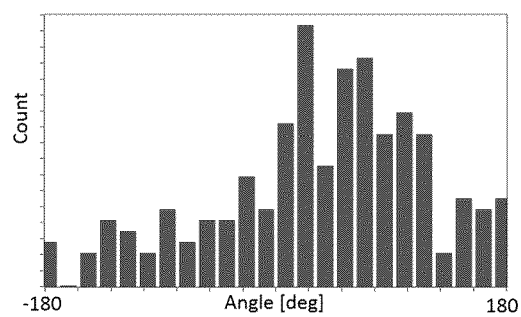
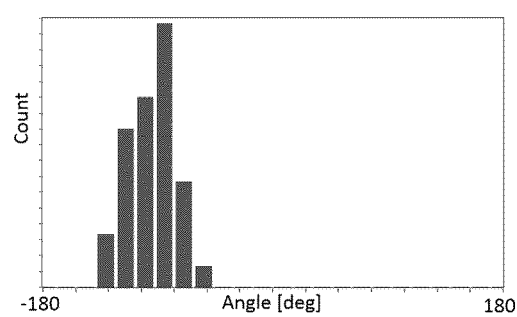
FIG. 3

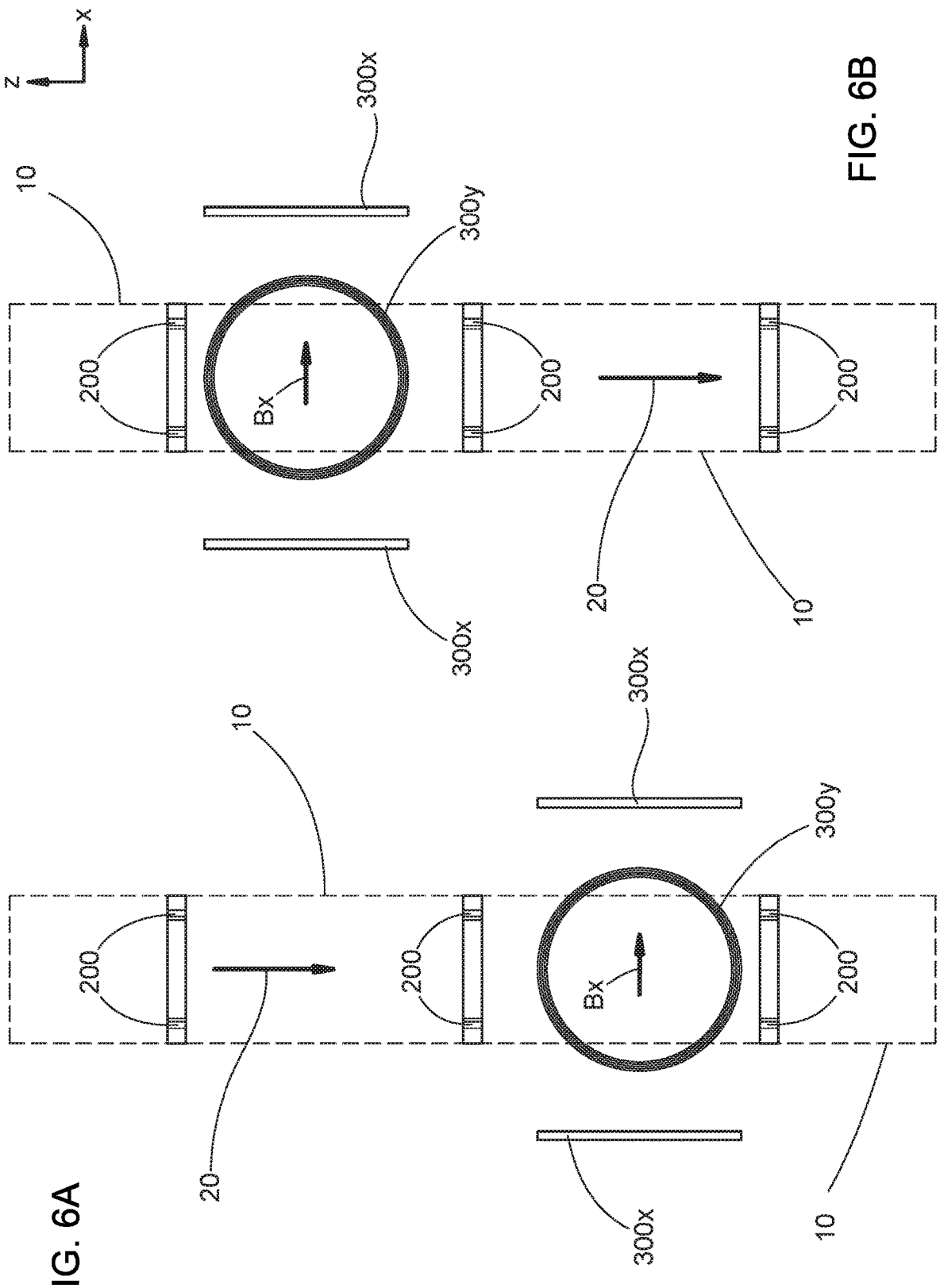

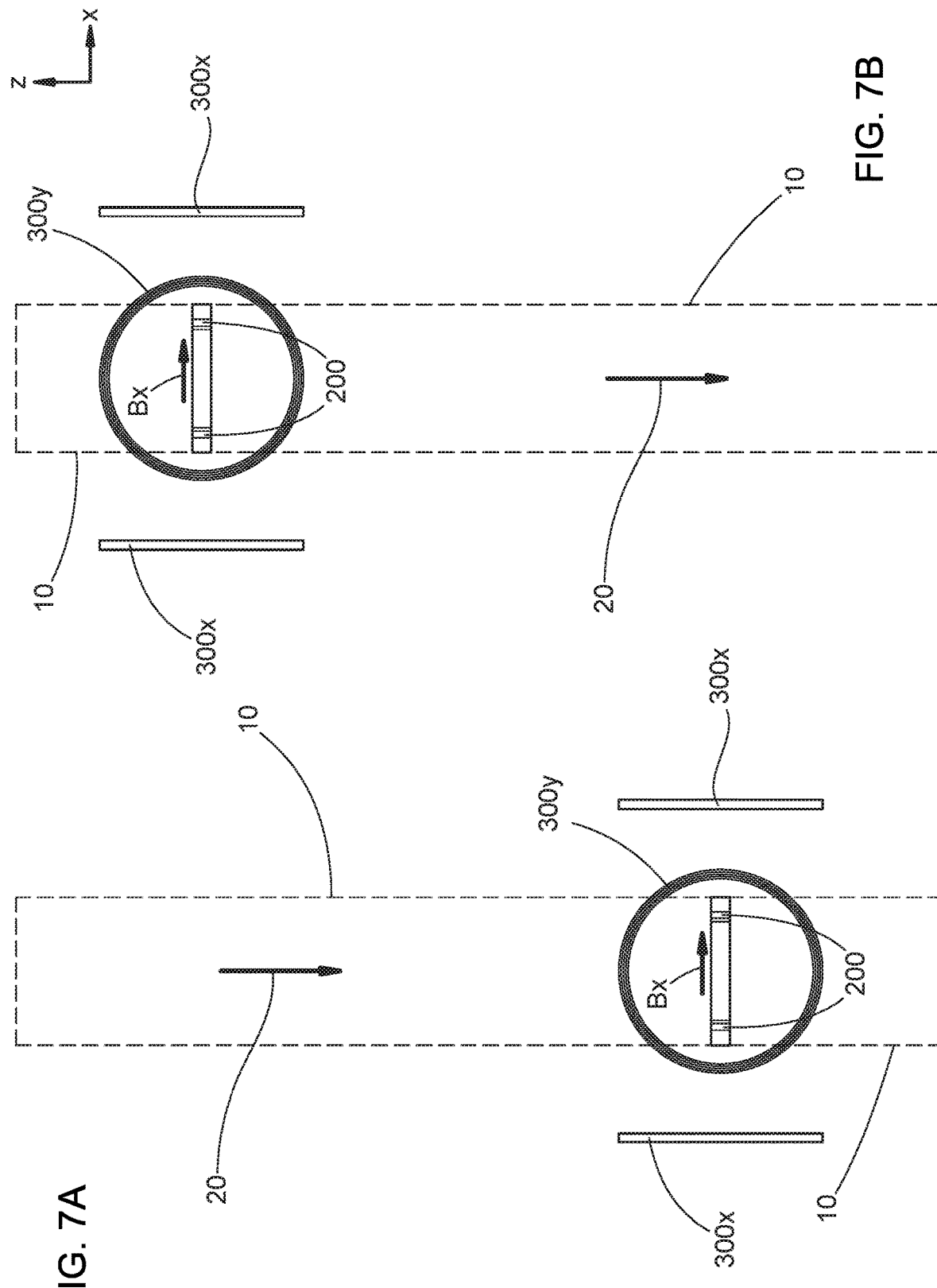

SENSING AND CONTROL OF POSITION OF AN ELECTRICAL DISCHARGE

BENEFIT CLAIMS TO RELATED APPLICATIONS

This application claims benefit of (i) U.S. provisional App. No. 62/617,036 entitled "Vacuum Arc Control using Arc Position Sensing and Induced Magnetic Fields" filed Jan. 12, 2018 in the names of Matthew A. Cibula, Joshua R. Motley, C. Rigel Woodside, and Paul E. King, and (ii) U.S. provisional App. No. 62/649,570 entitled "Sensing and control of position of an electrical discharge" filed Mar. 28, 2018 in the names of Matthew A. Cibula, Joshua R. Motley, C. Rigel Woodside, and Paul E. King. Each of said provisional applications is hereby incorporated by reference as if fully set forth herein.

FIELD OF THE INVENTION

The field of the present invention relates to sensing and controlling the position of a free-space electrical current, such as an electric arc or other electrical discharge. In particular, apparatus and methods are disclosed herein that include applying magnetic fields to alter an estimated position of the free-space electrical current, in response to an estimated position calculated based on sensing magnetic fields generated by the free-space electrical current.

BACKGROUND

Some examples of previous efforts to control or estimate the position of a free-space electrical current, such as an electric arc or other electrical discharge, are disclosed in:

- U.S. Pat. No. 2,727,936 entitled "Titanium furnace" issued Dec. 20, 1955 to Boyer;
- U.S. Pat. No. 2,727,937 entitled "High-vacuum titanium furnace" issued Dec. 20, 1955 to Boyer;
- U.S. Pat. No. 2,951,890 entitled "Method of operating an electric arc furnace" issued Sep. 6, 1960 to Yeomans et al;
- U.S. Pat. No. 2,972,695 entitled "Stabilisation of low pressure D.C. arc discharges" issued Feb. 21, 1961 to Wroe;
- U.S. Pat. No. 2,978,525 entitled "Magnetic field coil for concentrating the arc in a vacuum arc furnace" issued Apr. 4, 1961 to Gruber et al;
- U.S. Pat. No. 3,398,229 entitled "Non-consumable arc electrode" issued Aug. 20, 1968 to De Corso;
- U.S. Pat. No. 3,546,348 entitled "Non-consumable electrode vacuum arc furnaces for steel, zirconium, titanium and other metals and processes for working said metals" issued Dec. 8, 1970 to De Corso;
- U.S. Pat. No. 3,628,948 entitled "Electric arc vacuum remelting processes" issued Dec. 21, 1971 to Bruning;
- U.S. Pat. No. 3,680,163 entitled "Non-consumable electrode vacuum arc furnaces for steel, zirconium, titanium and other metals and processes for working said metals" issued Aug. 1, 1972 to De Corso;
- U.S. Pat. No. 3,708,279 entitled "Process of refining metal in a vacuum with coaxially mounted non-consumable electrodes" issued Jan. 2, 1973 to De Corso;
- U.S. Pat. No. 4,122,292 entitled "Electric arc heating vacuum apparatus" issued Oct. 24, 1978 to Karinsky;
- U.S. Pat. No. 4,581,745 entitled "Electric arc melting apparatus and associated method" issued Apr. 8, 1986 to Mathews et al;
- U.S. Pat. No. 4,762,165 entitled "Arc melting and casting method and apparatus thereof" issued Aug. 9, 1988 to Ogino et al;
- U.S. Pat. No. 5,373,529 entitled "Metals purification by improved vacuum arc remelting" issued Dec. 13, 1994 to Zanner et al;
- U.S. Pat. No. 8,111,059 entitled "Electrical current locator" issued Feb. 7, 2012 to King et al;
- U.S. Pre-grant Pub. No. 2018/0088164 entitled "Estimation of arc location in three dimensions" published Mar. 29, 2018 in the names of Cibula et al;
- JP S60-077939 entitled "Manufacture of ingot by vacuum-arc remelting" published May 2, 1985 in the name of Kobe Steel Ltd;
- JP H03-274382 entitled "Vacuum arc melting" published Dec. 5, 1991 in the name of Daido Steel Co Ltd;
- Zanner et al; Observations of melt rate as a function of . . . during vacuum consumable arc remelting of . . . ; Metallurgical & Materials Transactions B v15 p117 (1984);
- Zanner et al; On the Origin of Defects in VAR Ingots; International Symposium on Liquid Metal Processing and Casting, Santa Fe, N. Mex., USA, p13 (2005);
- WARD et al; Ensemble Arc Motion & Solidification During the Vacuum Arc Remelting of a Nickel-based Superalloy; Int'l Symp on Liquid Metal Processing & Casting; p49 (2005);
- Woodside; Investigating arc behavior in a DC vacuum arc remelting furnace using magnetic flux density measurements; masters thesis, Oregon State University; (2008);
- Woodside; Arc Distribution and Motion During the Vacuum Arc Remelting Process As Detected with a Magnetostatic Approach; PhD dissertation, Oregon State University (2010);
- Woodside et al; A Measurement System for Determining the Positions of Arcs During Vacuum Arc Remelting; IEEE Int'l Instrumentation & Measurement Tech Conf; p 452 (2010);
- Woodside et al: Characterizing Arc Motion and Distribution During Vacuum Arc Remelting; Int'l Symp on Liquid Metal Processing & Casting; v75 (2009); and
- Woodside et al; Arc Distribution During the Vacuum Arc Remelting of Ti-6Al-4V; Metallurgical & Materials Transactions B v44 n1 p154 (2012).

Each of the preceding patents, applications, and publications is hereby incorporated by reference as if fully set forth herein.

SUMMARY

An inventive apparatus comprises one or more magnetic field sensors, one or more magnetic field sources, and a control and data acquisition system that includes a computer system. The one or more magnetic field sensors are arranged about a lateral periphery of a current-containing volume through which a primary electric current flows in a predominantly longitudinal direction. The primary electric current flows through at least portions of first and second longitudinal electrical conductors, which are positioned end-to-end within the current-containing volume and are separated by a discharge gap, and flows between the conductors across the discharge gap as one or more primary electric discharges. The one or more primary electric discharges span the discharge gap and are movable in two transverse dimensions within the discharge gap between the first and second conductors.

Each one of the one or more magnetic field sensors is (i) operatively coupled to the control and acquisition system, (ii) positioned at a corresponding sensor position arranged about the lateral periphery of the current-containing volume, (iii) characterized by one or more corresponding sensor calibration parameters, and (iv) arranged so as to measure magnetic field components in two or more spatial dimensions. Each one of the one or more magnetic field sources is (i) operatively coupled to the control and acquisition system, (ii) positioned at a corresponding source position arranged about the lateral periphery of the current-containing volume, (iii) characterized by one or more source calibration parameters, and (iv) arranged so as to apply, in response to a corresponding control signal, a corresponding applied magnetic field having a corresponding non-zero component directed transversely across at least a portion of the current-containing volume that includes the discharge gap.

The computer system comprises one or more electronic processors and one or more digital storage media coupled thereto, and is structured, connected, and programmed so as to calculate an estimated transverse position of the one or more primary electric discharges within the discharge gap, and to generate, and transmit to the one or more magnetic field sources, the corresponding control signals. The calculation of the estimated discharge position is based at least in part on two or more of the measured magnetic field components along with one or more corresponding sensor positions or sensor calibration parameters. The generation of the control signals is based at least in part on the estimated transverse position of the one or more primary electric discharges along with one or more corresponding source positions or source calibration parameters. The resulting applied magnetic fields control or alter the estimated position of the electric discharge according to a selected discharge transverse trajectory or a selected discharge transverse distribution.

Objects and advantages pertaining to sensing and controlling the position of a free-space electrical current, such as an electric arc or other electrical discharge, may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 1A, 1B, and 1C are schematic isometric, top, and side views of an example inventive arrangement of magnetic sensors and sources coupled to a control and data acquisition system.

FIG. 3 illustrates a discharge transverse profile with (right) and without (left) an applied magnetic field.

FIGS. 6A and 6B are schematic side views of another example inventive arrangement of magnetic sensors and sources.

FIGS. 7A and 7B are schematic side views of another example inventive arrangement of magnetic sensors and sources.

The embodiments depicted are shown only schematically; all features may not be shown in full detail or in proper proportion, certain features or structures may be exaggerated relative to others for clarity, and the drawings should not be regarded as being to scale. The embodiments shown are only examples, and should not be construed as limiting the scope of the present disclosure or appended claims.

DETAILED DESCRIPTION OF EMBODIMENTS

The subject matter disclosed herein is related to subject matter disclosed in (i) U.S. provisional App. No. 62/617,036 filed Jan. 12, 2018 in the names of Cibula et al entitled "Vacuum Arc Control using Arc Position Sensing and Induced Magnetic Fields" (hereinafter referred to as the '036 application), (ii) U.S. provisional App. No. 62/649,570 filed Mar. 28, 2018 in the names of Cibula et al entitled "Sensing and control of position of an electrical discharge", (iii) U.S. Pat. No. 8,111,059 entitled "Electric current locator" issued Feb. 7, 2012 to King et al (hereinafter referred to as the '059 patent), and (iv) U.S. non-provisional application Ser. No. 15/715,018 entitled "Estimation of arc location in three dimensions" filed Sep. 25, 2017 in the names of Cibula et al (hereinafter referred to as the '018 application; published Mar. 29, 2018 as US Pre-grant Pub. No. 2018/0088164); said patent and said applications are incorporated by reference as if fully set forth herein.

Figure 9:
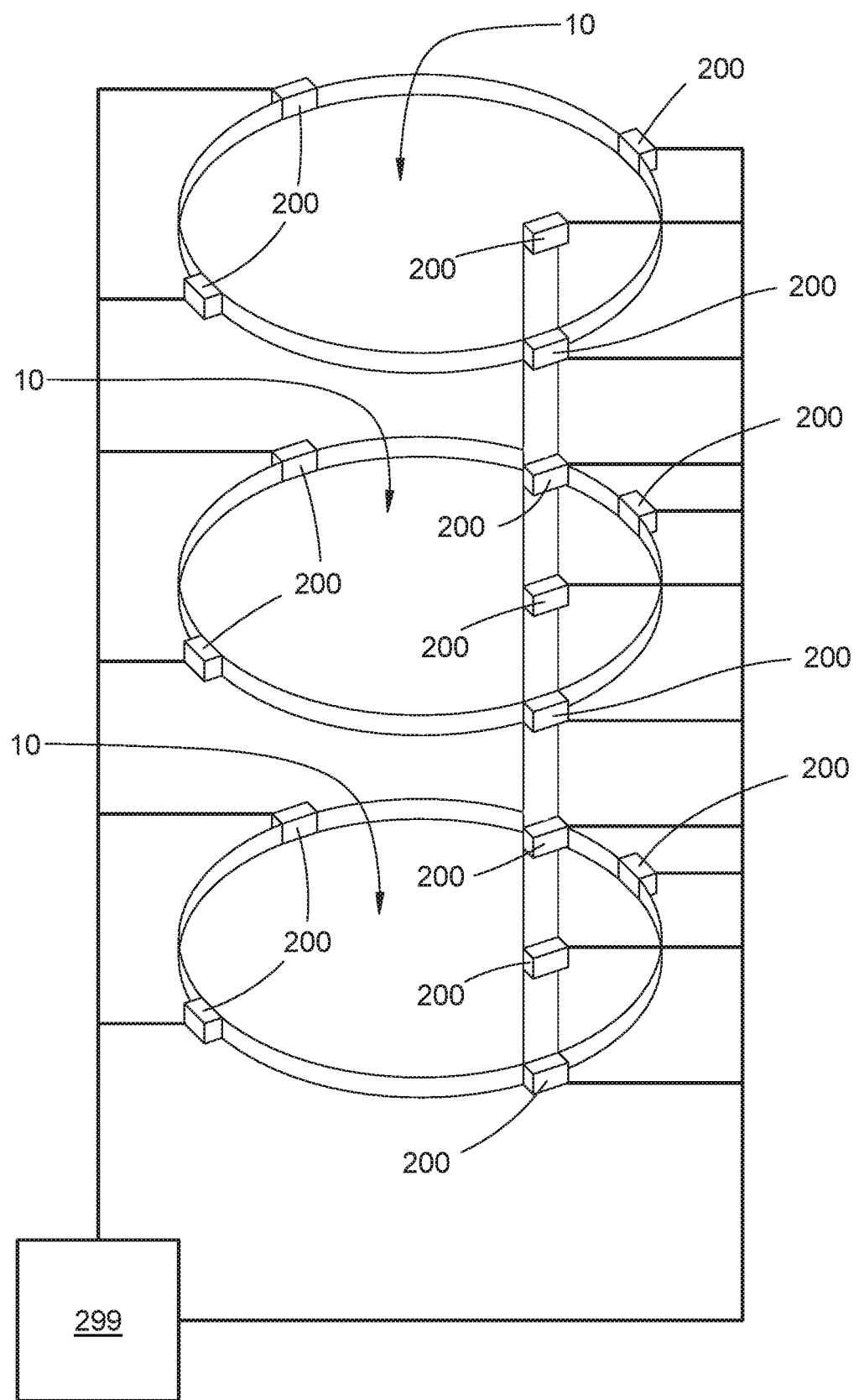
FIG. 9 is a schematic isometric view of an example arrangement of magnetic sensors coupled to a control and data acquisition system.
Figure 10:
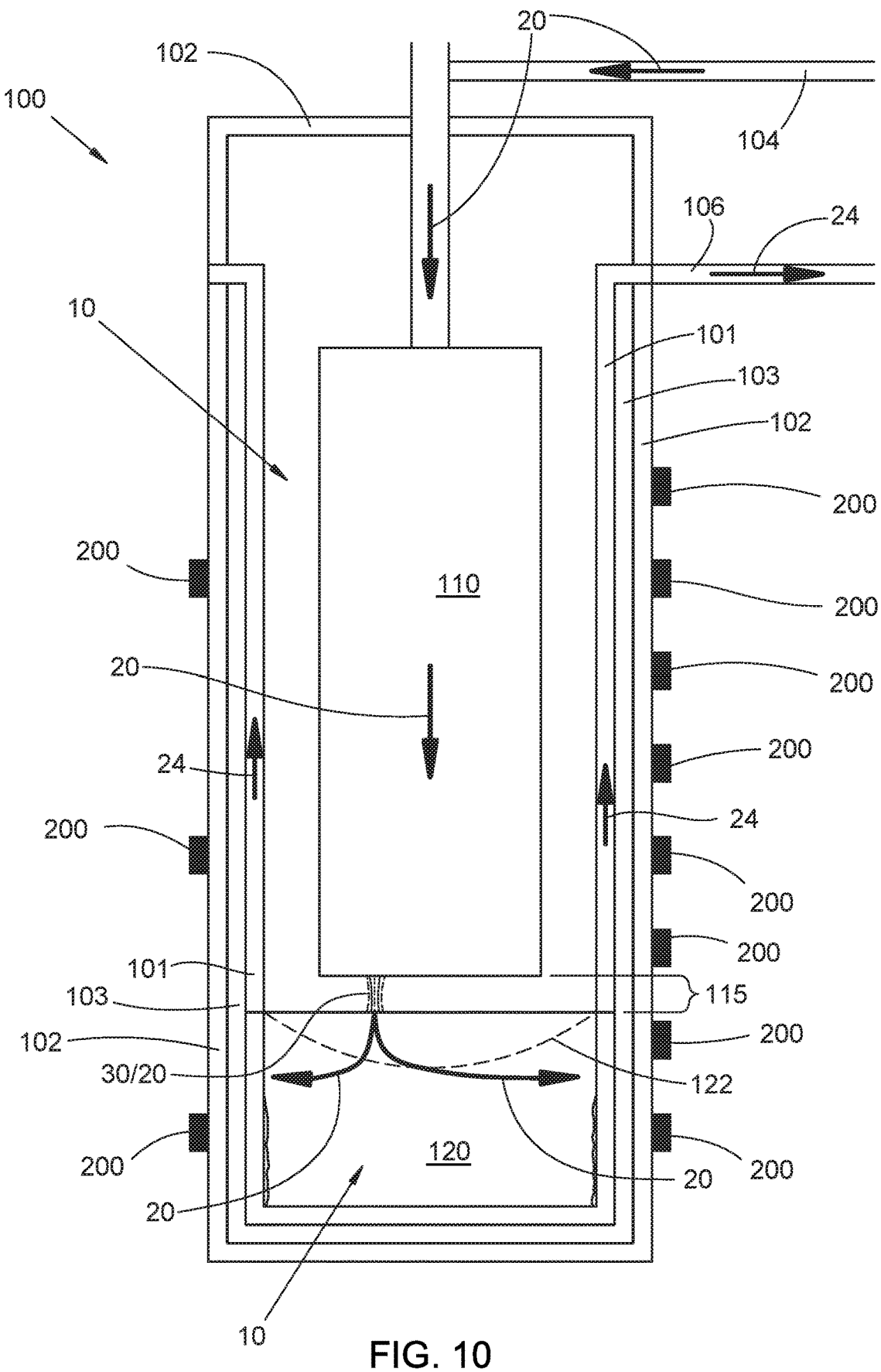
FIG. 10 is a schematic longitudinal cross section of an arc furnace with an example arrangement of magnetic sensors, and with a primary electric current flowing as a primary electric discharge across a discharge gap between electrodes.

The '059 patent and the '018 application disclose various apparatus and methods for estimating the location of an electric arc or other electric discharge. Examples from the '018 application are illustrated schematically in FIGS. 9 and 10. Such a system comprises a set of multiple magnetic field sensors 200 and a data acquisition system 299 that is operatively coupled to the magnetic field sensors 200 and that includes a computer system. FIGS. 9 and 10 illustrate schematically example arrangements of the multiple magnetic field sensors 200 around a lateral periphery of a current-containing volume 10. In some examples (e.g., as in FIG. 10) the current-containing volume 10 is the interior volume of a chamber such as an electric arc furnace 100 and is bounded by its walls, which define the lateral periphery of the current-containing volume 10. "Around the lateral periphery" or "about the periphery" can denote sensor positions exactly on the lateral boundary of the current-containing volume, or sensor positions inside or outside that lateral boundary. In some examples the sensor positions can span multiple distinct circumferential positions or multiple distinct longitudinal positions relative to the current-containing volume 10 (but not necessarily entirely surrounding the volume 10). In many examples (e.g., as in FIG. 10) the walls of the arc furnace 100 include an inner, electrically conductive crucible 101 (often made of copper), an outer wall 102, and a cooling water jacket 103 between them; in such examples the sensors 200 typically are positioned on the outer surface of the outer wall 102. Although such examples are a focus of the '018 application and the present disclosure, the apparatus and methods disclosed herein also can be employed within other types or arrangements of a current-carrying volume 10, while nevertheless remaining within the scope of the present disclosure or appended claims.

A primary electric current 20 flows generally longitudinally through the current-carrying volume 10. The terms "longitudinal" and "transverse" as used herein are defined relative to the desired direction of flow of the primary current 20. A boundary of the current-containing volume 10 in a transverse direction is referred to as a lateral boundary or a lateral periphery. For examples in which the current-containing volume 10 is contained within an electric arc furnace 100, the long axis of the furnace 100 defines the longitudinal direction or dimension (e.g., vertical in FIG. 10), and directions perpendicular to that furnace axis are the transverse directions or dimensions (e.g., horizontal in FIG. 10); side walls of the arc furnace 100 define the lateral periphery of the current-containing volume 10 within the arc furnace 100. The longitudinal direction or dimension may in some instances be referred to as the z-direction or z-dimension, or as the vertical direction or dimension; in such instances the transverse directions or dimensions may be referred to as the x- and y-directions or x- and y-dimensions, or as the horizontal directions or dimensions. Those additional designations or descriptors are arbitrary, are made only for convenience of description, and should not be construed as limiting the scope of the present disclosure or appended claims.

First and second longitudinal electrical conductors 110 and 120, respectively, are positioned end-to-end within the current-containing volume 10 and are separated by a discharge gap 115. In examples wherein the current-containing volume 10 is the interior of the arc furnace 100, the first longitudinal electrical conductor 110 can comprise the electrode 110 of the furnace 100, and the second longitudinal electrical conductor 120 can comprise the ingot 120 formed within the furnace 100. During operation of the furnace 100, the ingot 120 typically includes a pool of molten metal (i.e., the so-called melt pool 122) at its top surface (with the furnace 100 operated in its typical orientation, with its long axis oriented substantially vertically and with the electrode 110 positioned above the ingot 120). The primary current 20 flows through the first conductor 110, flows between the conductors 110/120 as one or more primary electric discharges 30 that span the discharge gap 115, and flows through the second conductor 120. The one or more primary electric discharges 30 are often in the form of one or more electric arcs spanning the discharge gap 115. In the arc furnace example, the primary current 20 flows through the electrode 110, flows between the electrode 110 and the ingot 120 as one or more primary discharges 30 spanning the discharge gap 115, and flows through at least a portion of the ingot 120. In the arc furnace example, the primary current 20 flows from the ingot 120 into the side walls of the crucible 101 and flows through at least portions of the crucible walls as a return current 24. It is typically assumed that the primary current 20 flows primarily from near the top of the ingot 120 into the side walls of the crucible 101 before flowing as the return current 24 (as in the drawings); it is also possible that at least a portion of the primary current 20 flows into the crucible walls elsewhere along the ingot 120, or at the bottom of the ingot 120, before flowing as the return current 24. The scope of the present disclosure and appended claims shall encompass each of those alternatives as well as any combination of one or more of those alternatives.

An electric arc furnace often is operated for the purpose of vacuum arc remelting, in which the electrode 110 is made of a high-value metal or alloy, and it is desired to improve the quality of the material (e.g., by improved homogeneity of macroscopic or microscopic structure or composition, by reduction of impurities, and so forth). Under vacuum conditions (e.g., less than about 1 mmHg or less than about 0.1 mmHg), a large electric current (e.g., several kiloamperes) is driven through the electrode 110 to strike an arc 30 against a small amount of seed material at the bottom of the crucible 101. The primary current 20 flowing as the primary electric discharge 30 (often in the form of one or more localized electric arcs) causes the electrode 110 to melt at the discharge gap 115 and form a melt pool 122. Solidification of the melted material forms and grows the ingot 120. As the remelting process proceeds, the ingot 120 grows, the electrode 110 shrinks, and the discharge gap 115 moves upward through the arc furnace 100. The water jacket 103 around the crucible 101 is employed to control the solidification rate and conditions to yield the desired properties of the ingot material. The electrode 110 has a smaller diameter then the crucible 101 (and hence the ingot 120 that is formed) to avoid current flow from the electrode 110 to the walls of the crucible 101. Because of this, the electrode 110 must be moved downward at the correct rate during operation of the furnace in order to maintain the correct height of the discharge gap 115 (i.e., the distance between the electrode 110 and the ingot 120) as the electrode 110 melts away and the ingot 120 grows. An arc furnace 100 can be any suitable or desirable length; many examples are over 100 inches long, or over 200 inches long, or even longer.

The diameter of the electrode 110 often is larger (sometimes much larger) than the transverse extent of the primary electric discharge 30 in the form of one or more localized electric arcs, thereby allowing the primary electric discharge 30 to move in two transverse dimensions within the discharge gap 115 between the electrode 110 and the ingot 120. In some instances, instead of one or more localized electric arcs, the primary electric discharge 30 can be a diffuse arc or discharge spread over a larger transverse area of the discharge gap 115, but typically still can move transversely within the discharge gap 115. Typical transverse dimensions of electrode 110 (e.g., the diameter of a cylindrical electrode 110) can include typical diameters from about 12 inches to about 36 inches, and can be as small as about 2 inches in diameter or as large as 50 inches in diameter or more; crucible transverse dimensions typically are somewhat larger than the electrode dimensions (e.g., about 1 inch larger, or about 2 to 4 inches larger; other suitable differences can be employed). The primary discharge 30, on the other hand, typically is no more than a few millimeters wide (e.g., each electric arc among one or more electric arcs), allowing the primary discharge 30 to move relatively freely across the transverse dimensions of the discharge gap 115. A more diffuse electric discharge 30 might be several inches in diameter, but still can move within the discharge gap 115 if the electrode diameter is sufficiently large. Transverse movement of the primary discharge 30 can affect the quality of the material forming the ingot 120. It would be desirable to provide an estimate of the transverse position of the primary electric discharge 30, as a function of longitudinal position along the ingot 120 (or equivalently, as a function of longitudinal position within the furnace 100 of the discharge gap 115). Such an estimate of the primary discharge transverse position can take a variety of forms and can be used for a variety of purposes. In some examples, a detailed trajectory of estimated positions of the primary electric discharge 30 can be generated and stored; in other examples a distribution function can be generated that reflects the relative probability density that the primary electric discharge 30 was at a particular transverse position; that density can be averaged over any suitable or desirable timescale, e.g., over 1 second, 10 seconds, 100 seconds, or other suitable interval. The estimated arc transverse position can be generated in real time as the furnace is operated, or can be generated later in so-called offline processing.

The '059 patent and the '018 application disclose various apparatus and methods for estimating the transverse position of the electric discharge 30. The details of those apparatus and methods need not be repeated here; the '059 patent and the '018 application are incorporated by reference into the present disclosure. Data representing the transverse discharge position as a function of melt time, longitudinal position of the discharge gap 115, or other analogous measurement, can be employed to evaluate quality of the ingot 120, or to diagnose detected quality problems.

The apparatus and methods of the present disclosure include active control or alteration of the transverse position of the electric discharge during the remelting process, in order to attain some degree of control over the remelting process (e.g., energy distribution, energy efficiency, energy optimization, and so forth) or the quality of the ingot 120 as it is formed (e.g., ingot density, ingot uniformity, density of voids or defects, and so forth). Control or alteration of the transverse position of the discharge is guided by, and performed in response to, the estimated discharge transverse position, and that capability is the new and useful result encompassed by the present disclosure and appended claims. Some of the documents listed above in the Background disclose attempts to control the position of the electric discharge 30 in an arc furnace to improve ingot quality. However, some among those earlier examples are only applicable to non-consumable electrodes having a stable electrode shape (e.g., U.S. Pat. No. 3,628,948 to Bruning or U.S. Pat. No. 3,708,279 to De Corso), and are therefore not suitable for an arc remelting furnace, wherein the electrode shape is not constant and cannot be well-characterized during the remelting process. Others among those earlier examples suffer from a lack of an accurate estimate of the transverse location of the electric discharge, or rely on unfounded assumptions of the nature of transverse movement of the discharge under the influence of an applied magnetic field (e.g., U.S. Pat. No. 4,581,745 to Mathews et al or U.S. Pat. No. 4,762,165 to Ogino et al).

Figure 1A:
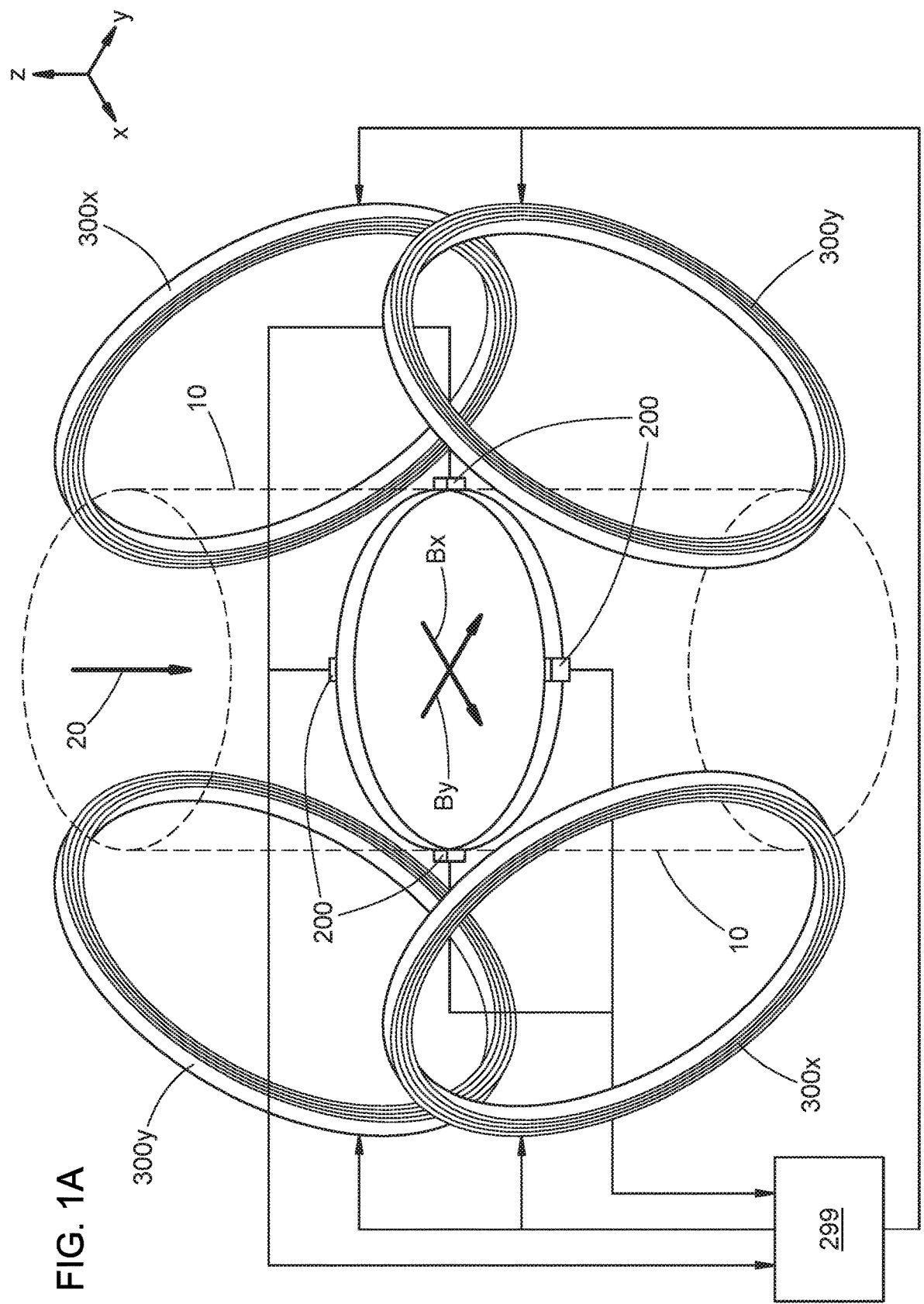
Figure 1B:
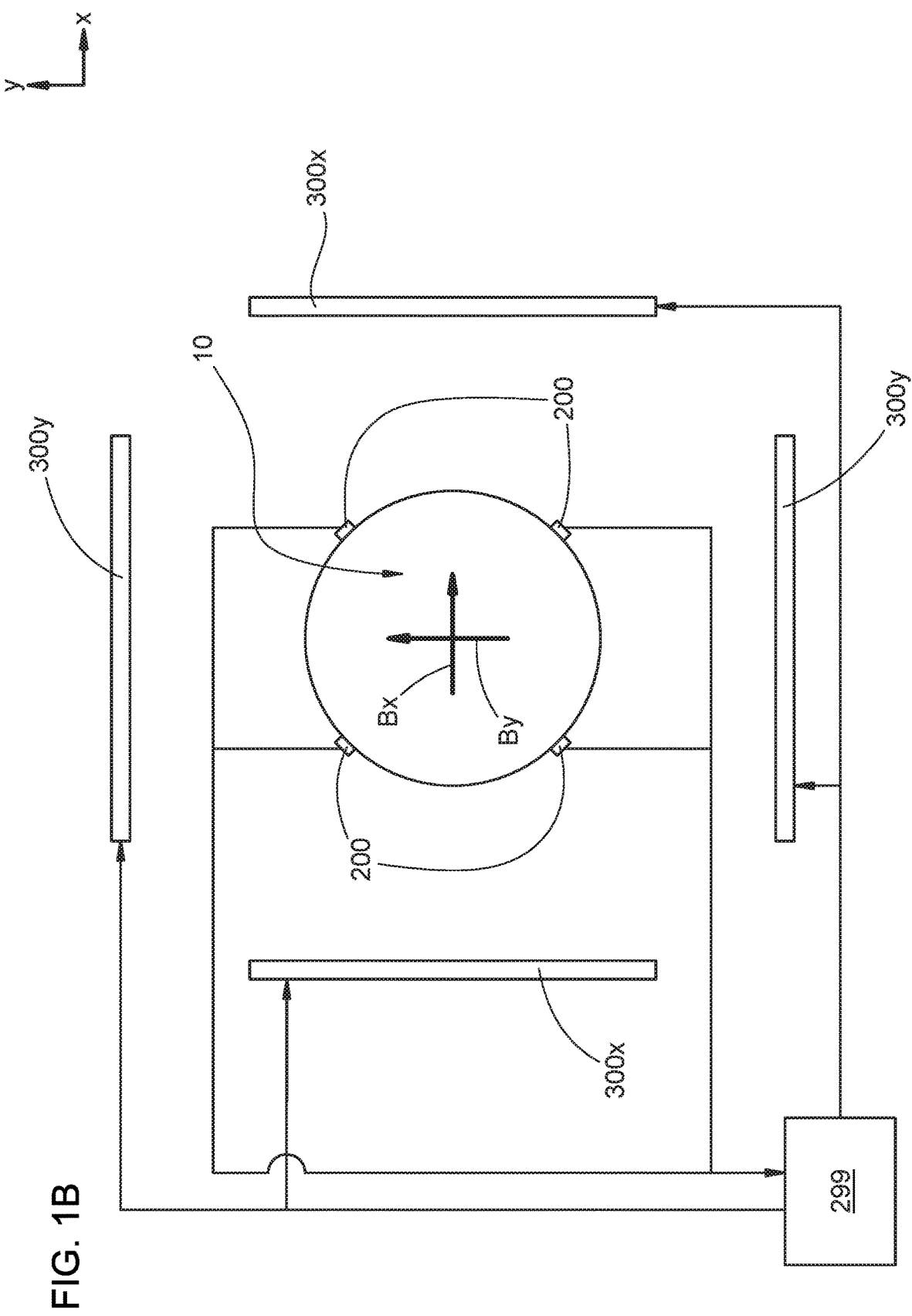
Figure 2:
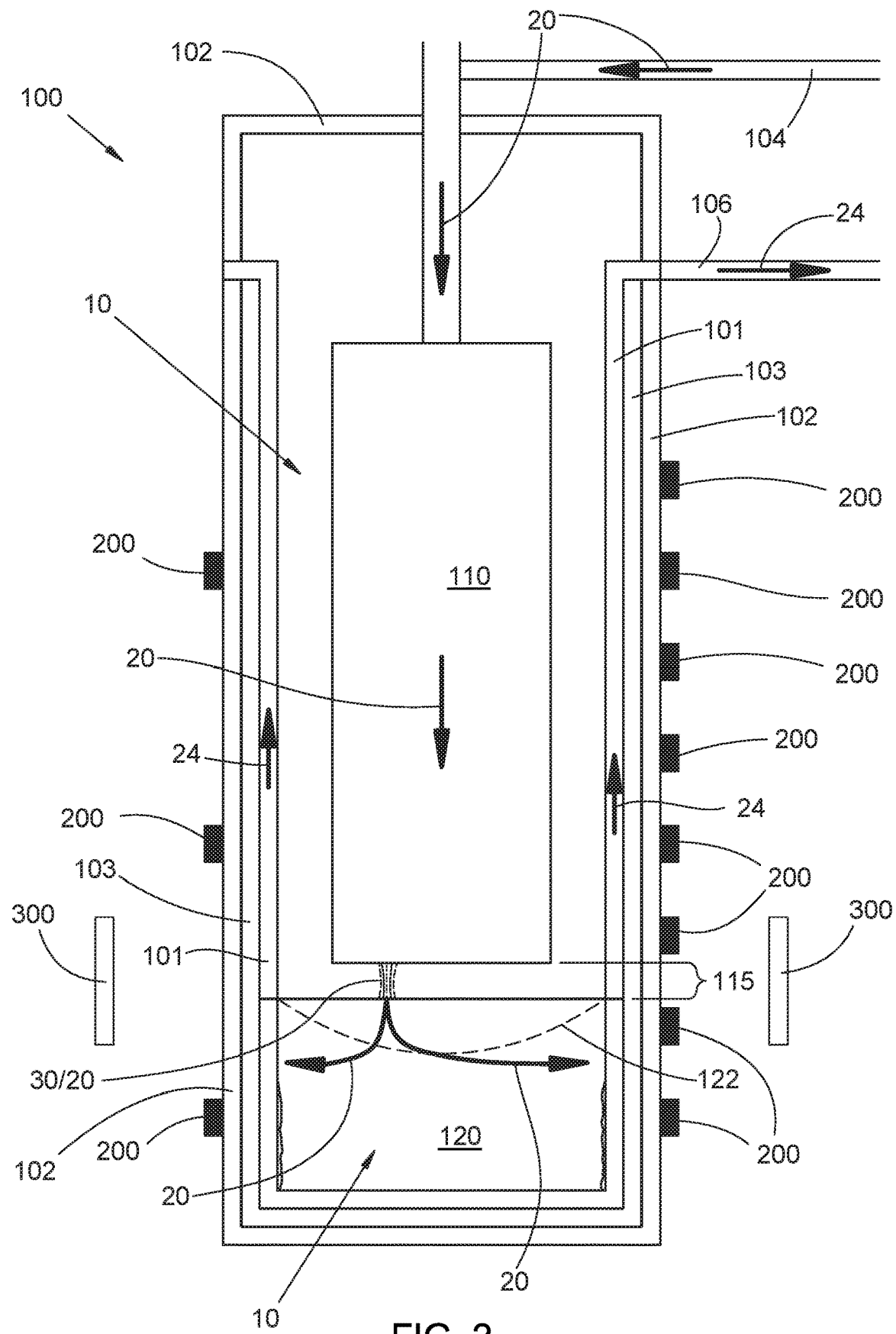
FIG. 2 is a schematic longitudinal cross section of an arc furnace with an example inventive arrangement of magnetic sensors and sources, and with a primary electric current flowing as a primary electric discharge across a discharge gap between electrodes.

An inventive apparatus of the present disclosure includes one or more magnetic field sensors 200, one or more magnetic field sources 300, and a control and data acquisition system 299 that includes a computer system. Various examples are illustrated schematically in FIGS. 1A-1C, 2, 5, 6A/6B, and 7A/7B. The magnetic field sensors 200 can be of any suitable type or construction, and are arranged about a lateral periphery of the current-containing volume 10. During operation, the primary electric current 20 flows in a predominantly longitudinal direction through the volume 10, through at least portions of first and second longitudinal electrical conductors 110 and 120, which are positioned end-to-end within the current-containing volume 10 and are separated by a discharge gap 115. The electrodes 110 and 120 are omitted from FIGS. 1A-1C, 5, 6A/B, and 7A/B for clarity, but are shown in FIG. 2 in the context of a vacuum arc furnace 100; apparatus and methods of the present disclosure can be used in other contexts as well, and are not limited to use only in conjunction with an arc furnace. One or more primary electric discharges 30 span the discharge gap 115, carry the primary current 20 across the discharge gap 115, and are movable in two transverse dimensions within the discharge gap 115 between the first and second conductors 110 and 120.

The magnetic field sensors 200 can be of any suitable type (e.g., Hall sensors) and are operatively coupled to the control and acquisition system 299. Each sensor 200 is positioned at a corresponding sensor position arranged about the lateral periphery of the current-containing volume, typically at or outside the lateral periphery of the current-containing volume 10. Typically, multiple sensors 200 are arranged among two or more distinct circumferential positions about the lateral periphery of the current-containing volume 10, or among two or more distinct longitudinal positions, or both. Each sensor 200 is characterized by one or more corresponding sensor calibration parameters, and is arranged so as to measure magnetic field components in two or more spatial dimensions. The one or more magnetic field sources (referred to collectively as sources 300) can be of any suitable type (e.g., paired coils) and also are operatively coupled to the control and acquisition system 299. The sources 300 are positioned at corresponding source positions arranged about the lateral periphery of the current-containing volume 10, typically at or outside the lateral periphery of the current-containing volume 10. Two sources (pairs of opposed coils $300x$ and $300y$) are specifically shown in the examples in the drawings; other suitable numbers or arrangements of the sources 300 can be employed. Each source 300 is characterized by one or more source calibration parameters, and is arranged so as to apply, in response to a corresponding control signal, a corresponding applied magnetic field. Each magnetic field thus applied has a corresponding non-zero component directed transversely across at least a portion of the current-containing volume 10 that includes the discharge gap 115.

The control and data acquisition system 299 includes a computer system, which in turn comprises one or more electronic processors and one or more digital storage media coupled thereto. The control and acquisition system 299 can typically include one or more analog-to-digital converters (A/Ds) or one or more digital-to-analog converters (D/As). The computer system is structured, connected, and programmed so as to calculate an estimated transverse position of the one or more primary electric discharges 30 within the discharge gap 115, and generate corresponding control signals. The calculation of the estimated transverse position of the electric discharge 30 is based at least in part on two or more of the measured magnetic field components, along with one or more corresponding sensor positions or sensor calibration parameters. The control signals are generated based at least in part on the calculated transverse position estimate of the one or more primary electric discharges 30, along with one or more corresponding source positions or source calibration parameters. The generated control signals are transmitted via the control and data acquisition system 299 to the corresponding magnetic field sources 300. The resulting applied magnetic fields (e.g. fields Bx and By) control or alter the estimated position of the electric discharge 30 according to a selected discharge transverse trajectory or a selected discharge transverse distribution (discussed further below).

The "transverse position" of the electric discharge 30 can be defined in any suitable way. One common definition of the estimated transverse position of the one or more primary electric discharges 30 includes an estimated transverse position of a centroid of a total current density of the one or more primary electric discharges. The definition of estimated transverse position can further include widths in two dimensions of the total current density, defined in any suitable or desired way (e.g., full-width at half-maximum, second moments, or other width parameters such as those used to characterize statistical distributions). In some examples, the discharge 30 can be treated as multiple discrete discharges, each characterized by corresponding position and widths. Other suitable characterization or parameterization schemes can be employed.

A "discharge transverse trajectory" shall denote a transverse two-dimensional path followed by the electric discharge 30 within the discharge gap 115 while the primary current 20 flows through the current-containing volume 10 and across the discharge gap 115. Examples of discharge transverse trajectories that can be employed include but are not limited to a raster pattern, a single circular path or multiple concentric circular paths, an elliptical path or multiple confocal circular paths, a spiral path, one or more parallel or non-parallel linear paths, or an irregular path. In addition to spatial variations of the path, the transverse speed of the electric discharge 30 as it follows that transverse path can be controlled or altered as well, and such control or alteration can be employed, e.g., to achieve a selected discharge transverse distribution (discussed below). For example, the speed can remain substantially constant with time, or can vary sinusoidally with time, or can vary in some other suitable way, and any suitable speed variation can be combined with any suitable transverse trajectory (e.g., constant speed along a circular trajectory, or sinusoidally varying speed along a raster path). In some examples, the trajectory can be constrained or altered by topology of the electrode surface. For example, an electrode formed from multiple rods welded together side-by-side may have multiple discrete areas of electrode surface separated from one another, yielding a multipolar electrode. A discharge trajectory in such an example might include multiple corresponding disjoint trajectories for the discrete areas of the electrode surface.

A "discharge transverse distribution" shall denote the transverse position of the electric discharge averaged over a certain specified time interval. The transverse distribution typically depends on a combination of the trajectory and the speed of movement, the size and shape of the discharge, and the number of discharges. Variation of one or more of those can yield myriad different examples of transverse distributions. In one specific example, a constant speed along a raster trajectory can yield a substantially uniform distribution; in another specific examples, a constant speed along a single circular path can yield a flat-topped gaussian or doughnut distribution (depending on the width of the discharge 30 relative to the radius of the circular path).

Figure 4:
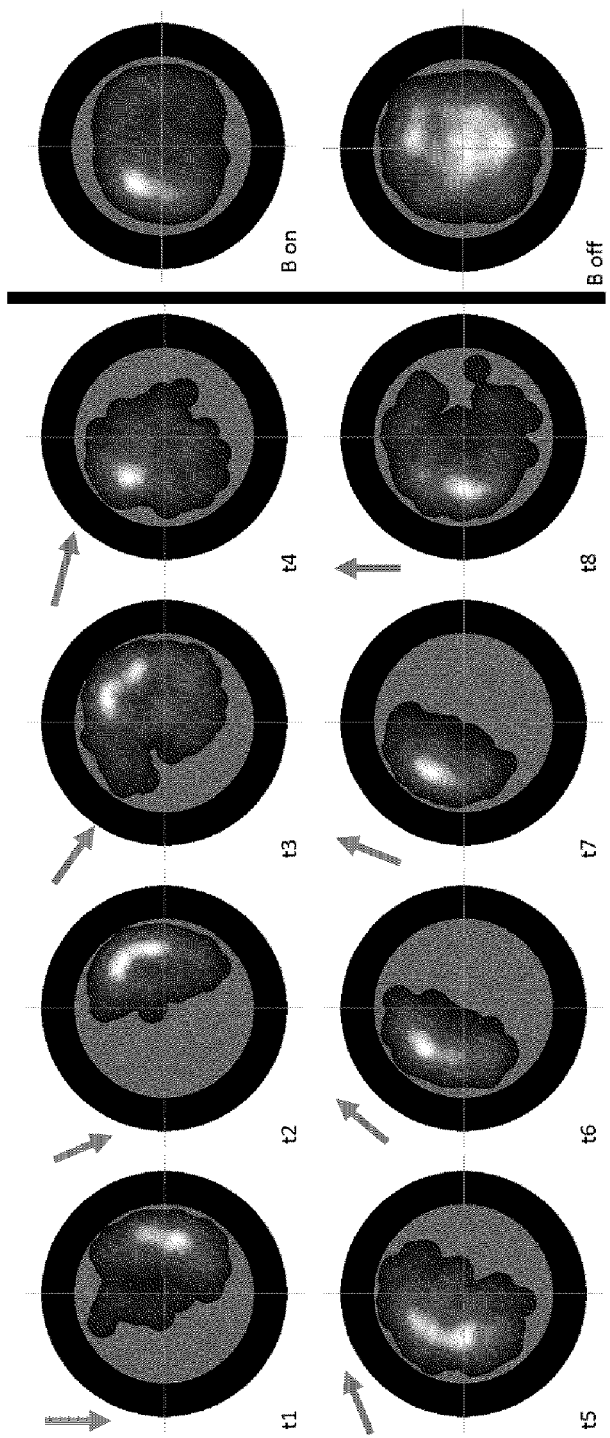
FIG. 4 illustrates a time series of discharge transverse profiles resulting from a varying applied magnetic field, a discharge transverse distribution resulting from a time average of the profiles (upper right), and a discharge transverse distribution with no applied magnetic field (lower right).

FIG. 3 shows example behavior of a discharge transverse profile. In the left-hand panels, no magnetic field is applied; in the right-hand panels, a magnetic field is applied parallel to the x-axis, yielding the expected movement of the electric discharge along the y-axis. In the presence of the applied field, the discharge transverse distribution becomes narrower and shifts along the y-axis. In FIG. 4, a series of eight discharge transverse profiles are shown at one-second intervals as the applied magnetic field is rotated through 180° over eight seconds. The profiles are seen to rotate about halfway around the electrode (i.e., along a generally circular trajectory). The rightmost two panels show a distribution averaged over the entire 8-second interval (upper) versus a distribution with no applied field (lower). Note the greater uniformity of the averaged distribution as the applied field is rotated to move the discharge around on the electrode surface.

In some examples, the magnetic field sources 300 can be operated substantially continuously (e.g., during the entire duration of an arc remelting process), for controlling or altering the transverse position of the electric discharge 30. In other examples, the magnetic field sources 300 are operated only intermittently, e.g., only when certain conditions are observed or detected by the magnetic sensors 200 and the control and acquisition system 299. In one such example, the electric discharge 30 can be allowed to move about freely during most of an arc remelting process, without operation of the sources 300. If an undesirable condition is detected, however, the control and acquisition system 299 can activate one or more sources 300 for a limited duration to mitigate the undesirable condition, after which the sources 300 can be deactivated. Examples of undesirable conditions that could be mitigated by intermittent activation of the sources 300 can include, but are not limited to, a so-called side arc between the electrode 110 and the crucible 101, a constricted arc, or so-called pinning of an arc at a fixed location.

It has been observed that transverse movement of the electrical discharge 30 does not necessarily correspond to the transverse motion expected by simple calculation of the Lorentz force exerted by an applied magnetic field on the electrical discharge (the expected motion being referred to herein as normal motion of the discharge). Instead, transverse movement of the electrical discharge 30 in the direction opposite the expected direction is seen to occur in some instances (referred to herein as anomalous motion of the discharge). It is speculated that, for perfectly flat, perfectly parallel, defect-free electrode surfaces, the calculated Lorentz force would accurately predict the movement of the electrical discharge, but irregularities, defects, or misalignments of the electrode surfaces can result in instances of such anomalous movement of the electrical discharge. Other mechanisms could be applicable, such as variation in arc pressure, the presence of slag particles in the melt pool 122 on the ingot 120, or other unknown mechanism(s). In the context of vacuum arc remelting, the likelihood of perfect electrode conditions is quite small. The electrode 110 typically is of relatively low quality (hence the need for the remelting process!) and therefore likely to include inclusions, voids, or other defects, and is unlikely to have a smooth finished surface at the discharge gap. Even if it had such a surface at the outset, the remelting process itself is localized to the location of the discharge (hence the need for transverse position control!) and would likely degrade the surface quality of the electrode 110 as the remelting process progressed.

Regardless of the mechanism that gives rise to the sometimes-observed anomalous movement of the discharge in response to an applied magnetic field, such anomalous movement should be detected and accounted for in the present inventive apparatus and methods. For example, if a simple negative feedback arrangement were employed to control the discharge transverse position, a switch from normal to anomalous movement of the discharge would effectively change the stable negative feedback arrangement into an unstable positive feedback arrangement. Even if the expected motion does not reverse itself, the magnitude of discharge movement with respect to applied magnetic field can change as the surface of the electrode degrades or as it moves longitudinally (e.g., during the remelting process). Accordingly, the control and acquisition system 299 can be structured, programmed, and connected so as to update the one or more source calibration parameters for at least one of the one or more magnetic field sources 300, in order to account for transitions from normal to anomalous discharge movement and vice versa. Such an update of source calibration parameters can be based at least in part on one or more previously transmitted control signals and the estimated transverse position of the electric discharge resulting from the corresponding magnetic fields applied as a result of those previously transmitted control signals. In other words, as each control signal is applied, the resulting estimated discharge transverse position is compared to that expected based on the current calibration parameters. If there is substantial agreement, then no change need be made. If there is functionally significant disagreement in magnitude or direction (e.g., due to longitudinal movement of the discharge gap 115 or alteration or degradation of the electrode surface), then the appropriate calibration parameter(s) can be updated to match the most recently observed movement, and the updated parameter(s) used for subsequent movement until another mismatch is detected and the update process is repeated.

In one example, the source calibration parameters include a table of previously estimated positions of the electric discharge as a function of corresponding control signals previously transmitted to the one or more magnetic field sources. In other words, a history is kept of discharge transverse position versus applied magnetic field(s). Updating the one or more source calibration parameters would therefore include updating the table to include a currently estimated position, corresponding to a given value or range of control signals, upon observing a significant deviation between the currently estimated position and a previously estimated position corresponding to that given value or range of control signals. In other words, the control and data acquisition system 299 acts according to the most recent position-versus-magnetic-field history, ignoring earlier history as it is superseded.

In another example, the source calibration parameters include one or more corresponding feedback coefficients for controlling the one or more magnetic field sources in response to the estimated position of the electric discharge. In such an example, updating the one or more source calibration parameters includes updating the one or more corresponding feedback coefficients (magnitude and/or sign, with a change of sign indicating a transition from normal to anomalous motion or vice versa). The feedback coefficient can be updated in response to a currently estimated position of the electric discharge and a corresponding currently transmitted control signal. Alternatively, each corresponding control signal can include a superposed oscillatory dither signal. Phase-sensitive detection or other suitable technique can be employed to detect an oscillatory component of one or more of the magnetic field components measured by one or more of the magnetic field sensors, from which a corresponding updated feedback coefficient can be calculated.

To effect fully two-dimensional transverse movement of the electrical discharge in response to the applied magnetic fields, the apparatus can include two or more of the magnetic field sources 300 that are arranged so that the corresponding applied magnetic fields have corresponding non-zero components directed transversely across the discharge gap 115, with their corresponding transverse magnetic field components not being parallel to one another. In some examples, those field components are generally orthogonal (e.g., in FIGS. 1A through 1C, source 300$x$ produces magnetic field Bx directed generally parallel to the x-axis, and source 300$y$ produces magnetic field By directed generally parallel to the y-axis). Such a non-parallel or orthogonal arrangement enables controlling or altering the estimated transverse position of the electric discharge 30 in two transverse dimensions within the discharge gap 115.

In some examples, each one of the one or more magnetic field sources 300 is arranged so that the corresponding applied magnetic field has a substantially uniform non-zero amplitude within the discharge gap 115 and is directed substantially transversely across the discharge gap 115. In some examples, each one of the one or more magnetic field sources 300 comprises a corresponding pair of conductive coils arranged on opposite lateral sides of the current-containing volume, with corresponding coil axes substantially collinear and directed substantially transversely. In the examples of the drawings, source 300$x$ includes an opposed pair of coils, as does source 300$y$. Each such pair of coils is connected to the control and acquisition system 299 so that a corresponding electric current provided by the control and acquisition system 299 flows through the pair of coil and generates the corresponding applied magnetic field directed generally along the corresponding coil axes.

Figure 8:
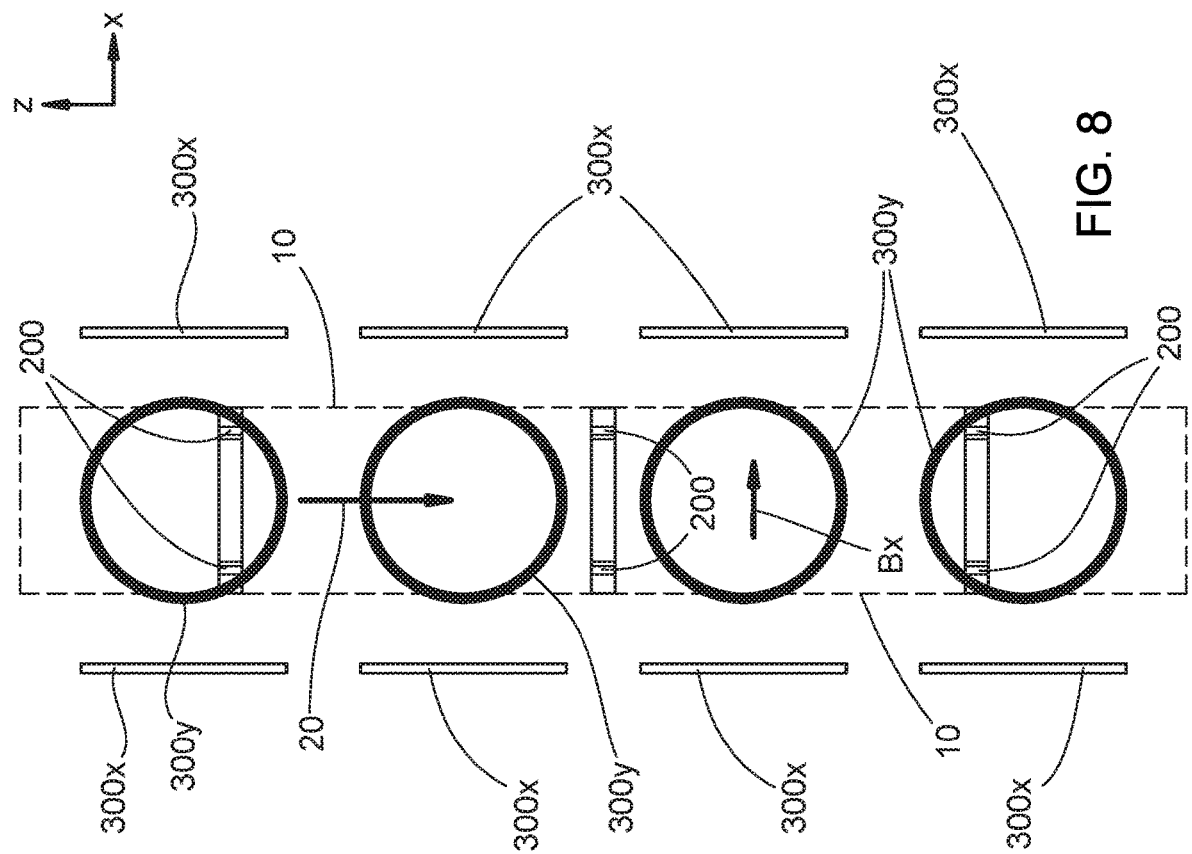
FIG. 8 is a schematic side view of another example inventive arrangement of magnetic sensors and sources.

As noted above, in some examples the discharge gap 115 is moveable longitudinally within the current-containing volume, such as during an arc remelting process. In some of those examples, each one of the one or more magnetic field sources 300 can be arranged so that the corresponding applied magnetic field has a non-zero transverse component across all portions of the current-containing volume 10 wherein the discharge gap 115 can be located. Such an arrangement can be realized, e.g., by using pairs of coils 300 that are elongated along the longitudinal direction (e.g., as in the example of FIG. 5), so that they extend along the entire length (or at least nearly so) of the volume 10 where the discharge gap 115 can be located. Alternatively, multiple magnetic field sources 300 can be positioned at different longitudinal positions along the current containing-volume 10 (e.g., as in the example of FIG. 8, showing four sets of sources 300$x$/300$y$ at four corresponding different longitudinal positions along the current-containing volume 10). In some instances, all of those magnetic field sources 300 can be operated simultaneously so that the corresponding applied magnetic field has a non-zero transverse component across all portions of the current-containing volume 10 wherein the discharge gap 115 can be located (a result similar to the result achieved using the example arrangement of FIG. 5). In other instances, various subsets of the sources 300 can be operated selectively based on the estimated position of the discharge gap 115, with the remaining sources 300 being inactive. As the discharge gap 115 moves longitudinally along the current-containing volume 10, different sources 300 can be successively activated or deactivated, so a region of relatively high transverse applied magnetic field travels longitudinally along the current-carrying volume 10 so that there is substantially overlap of that region with the discharge gap 115 as it moves. In such instances, the control and acquisition system 299 can be structured, programmed, and connected so as to effect the selective activation or deactivation of the multiple magnetic field sources 300 in response to longitudinal movement of the discharge gap 115.

Alternatively, in other examples wherein the discharge gap 115 is movable along the volume 10, at least one of the one or more magnetic field sources 300 can be arranged so as to be moveable longitudinally with respect to the current-containing volume 10 (e.g., as in the example of FIGS. 6A and 6B, showing the sources 300x/300y at different longitudinal positions along the current-continuing volume 10). In such examples, the control and acquisition system 299 can be structured, programmed, and connected so as to effect longitudinal movement of the moveable magnetic field source(s) 300 in response to longitudinal movement of the discharge gap 115. In those examples, it typically would be the case that the moveable magnetic field source 300 would produce only negligible applied field amplitude in at least portions of the current-containing volume 10 that are displaced longitudinally from the discharge gap 115. That can be advantageous when coils are employed as the field source(s) 300, because smaller coils yield a higher magnetic field amplitude for a given current flow through the coils. That same advantage can be realized in the example of FIG. 8 described above. In some examples with moveable sources 300, at least one of the magnetic sensors 200 can also be arranged to be moveable longitudinally with respect to the current-containing volume 10 (e.g., as in the example of FIGS. 7A and 7B, showing the sources 300x/300y and the sensors 200 at different longitudinal positions along the current-containing volume 10). In those examples, the control and acquisition system 299 can be structured, programmed, and connected so as to effect longitudinal movement of the moveable magnetic field sensor 200 in response to longitudinal movement of the discharge gap 155 or the moveable magnetic field source 300. Note that stationary sensors 200 at one or more longitudinal positions can be used in combination with stationary sources 300 at one or more longitudinal positions or with one or more sources 300 that move longitudinally. Likewise, sensors 200 that move longitudinally can be used in combination with stationary sources 300 at one or more longitudinal positions or with one or more sources 300 that move longitudinally.

Figure 5:
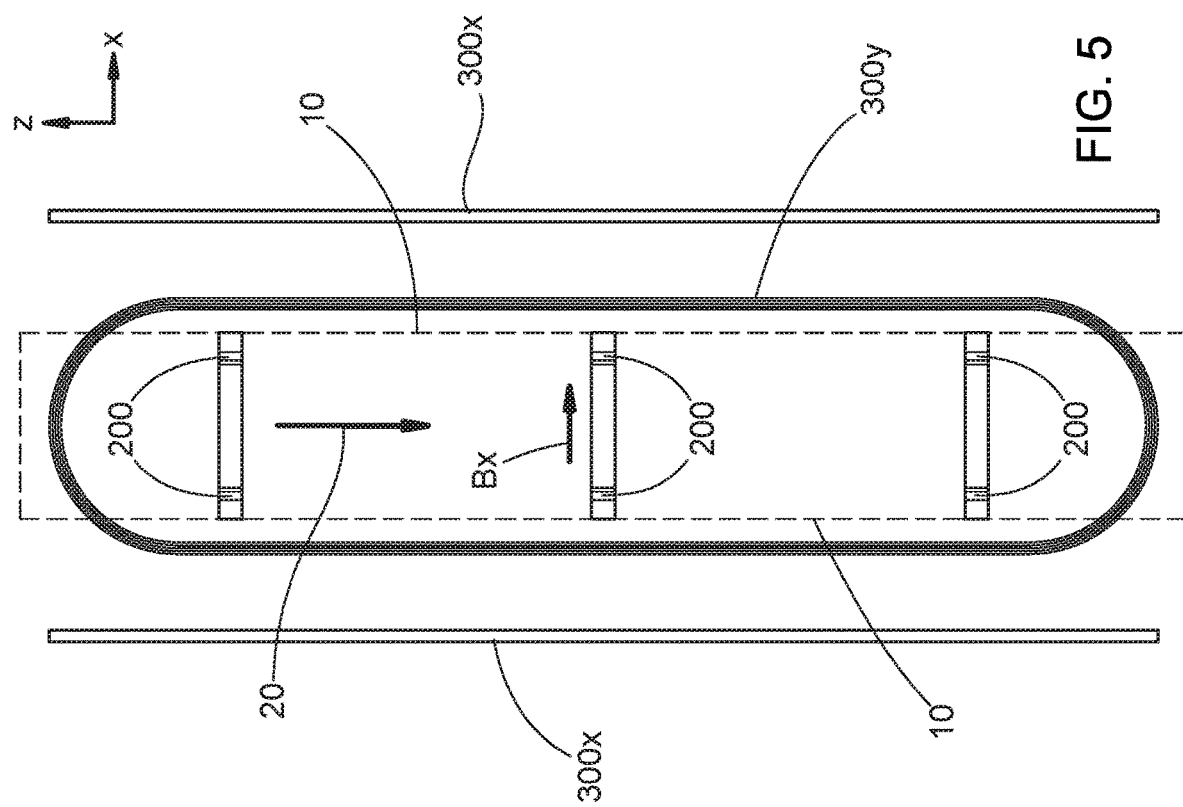
FIG. 5 is a schematic side view of another example inventive arrangement of magnetic sensors and sources.

In the examples of FIGS. 1A through 1C and 7A/7B, the multiple sensors 200 are arranged about the volume 10 at similar longitudinal sensor positions. In the examples of FIGS. 2, 5, 6A/6B, and 8, the sensors are arranged among two or more distinct longitudinal positions along the current-containing volume 10, as well as among two or more distinct circumferential positions around the lateral periphery of the current-containing volume 10. In some examples, each sensor 200 can be arranged so as to measure magnetic field components in two substantially transverse spatial dimensions or in three spatial dimensions. In examples wherein the discharge gap 115 is movable longitudinally within the current-containing volume 10, the sensor calibration parameters can vary according to longitudinal movement of the discharge gap 115.

The sensors 200 measure all magnetic fields present, including magnetic field components arising from (i) external conductors carrying the primary electric current 20 into the current-containing volume 10 or carrying a return current 24 out of the current-containing volume 10, (ii) external magnetic fields in which the current-carrying volume 10 is immersed, (iii) the magnetic fields applied by the one or more magnetic field sources 300, or (iv) external conductors (if any) carrying electric current to the sources 300. Accordingly, calculating the estimated position of the electric discharge 30 can include corrections for one or more of those additional magnetic field components.

As noted above, the inventive apparatus is commonly used for monitoring and controlling or altering an arc remelting process. Accordingly, in some examples the current-containing volume 10 can be enclosed within a chamber (e.g., the vacuum arc furnace 100) that defines the lateral periphery of the current-containing volume 10. In such examples, the sensor and source positions can be, and often are, located outside the chamber. In the example of a vacuum arc furnace 100, the first conductor 110 comprises an electrode of the furnace 100, the second conductor 120 comprises an ingot formed within the furnace 100, and the furnace is arranged so that the discharge gap 115 moves longitudinally through the furnace as the primary electric current 20 flows during a melt period, causing the electrode 110 to melt and shrink and the ingot 120 to grow. The control and acquisition system 299 can be structured, programmed, and connected so as to calculate an estimated discharge gap longitudinal position that changes with melt time as the primary electric current 20 flows during the melt period.

An inventive method, employing any of the disclosed inventive apparatus, includes: (A) using the one or more magnetic field sensors 200, measuring corresponding magnetic field components in two or more spatial dimensions at each corresponding sensor position; (B) using the computer system, calculating the estimated transverse position of the one or more primary electric discharges 30 within the discharge gap 115; (C) using the computer system, generating, and transmitting to the one or more magnetic field sources 300, the corresponding control signals; and (D) using the one or more magnetic field sources 200, applying the corresponding applied magnetic fields in response to the corresponding control signals, thereby controlling or altering the estimated transverse position of the one or more primary electric discharges 30.

Another example of an inventive method can further include using the computer system, updating the one or more source calibration parameters for at least one of the one or more magnetic field sources 300, based at least in part on one or more previously transmitted control signals and the estimated transverse position of the electric discharge 30 resulting from the corresponding magnetic fields applied as a result of those previously transmitted control signals.

In another example of an inventive method, (E) the current-containing volume 10 is enclosed within an electric arc furnace 100 that defines the lateral periphery of the current-containing volume 10, and the sensor and source positions are located outside the furnace; (F) the first conductor 110 comprises an electrode of the furnace 100, the second conductor 120 comprises an ingot formed within the furnace 100, and the furnace 100 is arranged so that the discharge gap 115 moves longitudinally through the furnace 100 as the primary electrical current 20 flows during a melt period, causing the electrode 110 to melt and shrink and the ingot 120 to grow; and (G) parts (A) through (D) are performed during the melt period.

Further details of the sensors 200 and the control and data acquisition system 299 are disclosed in the '059 patent and the '018 application incorporated above, and need not be repeated here.

The systems and methods disclosed herein can be implemented as or with general or special purpose computers or servers or other programmable hardware devices programmed through software, or as hardware or equipment "programmed" through hard wiring, or a combination of the two. A "computer" or "server" can comprise a single machine or can comprise multiple interacting machines (located at a single location or at multiple remote locations). Computer programs or other software code, if used, can be implemented in tangible, non-transient, temporary or permanent storage or replaceable media, such as by including programming in microcode, machine code, network-based or web-based or distributed software modules that operate together, RAM, ROM, CD-ROM, CD-R, CD-R/W, DVD-ROM, DVD±R, DVD±R/W, hard drives, thumb drives, flash memory, optical media, magnetic media, semiconductor media, or any future computer-readable storage alternatives.

In addition to the preceding, the following examples fall within the scope of the present disclosure or appended claims:

Example 1. An apparatus comprising one or more magnetic field sensors, one or more magnetic field sources, and a control and data acquisition system that includes a computer system, wherein: (a) the one or more magnetic field sensors are arranged about a lateral periphery of a current-containing volume through which a primary electric current flows in a predominantly longitudinal direction (i) through at least portions of first and second longitudinal electrical conductors, which are positioned end-to-end within the current-containing volume and are separated by a discharge gap, and (ii) as one or more primary electric discharges spanning the discharge gap and movable in two transverse dimensions within the discharge gap between the first and second conductors; (b) each one of the one or more magnetic field sensors is (i) operatively coupled to the control and acquisition system, (ii) positioned at a corresponding sensor position arranged about the lateral periphery of the current-containing volume, (iii) characterized by one or more corresponding sensor calibration parameters, and (iv) arranged so as to measure magnetic field components in two or more spatial dimensions; (c) each one of the one or more magnetic field sources is (i) operatively coupled to the control and acquisition system, (ii) positioned at a corresponding source position arranged about the lateral periphery of the current-containing volume, (iii) characterized by one or more source calibration parameters, and (iv) arranged so as to apply, in response to a corresponding control signal, a corresponding applied magnetic field having a corresponding non-zero component directed transversely across at least a portion of the current-containing volume that includes the discharge gap; and (d) the computer system comprises one or more electronic processors and one or more digital storage media coupled thereto, and is structured, connected, and programmed so as to (i) calculate an estimated transverse position of the one or more primary electric discharges within the discharge gap, that calculation being based at least in part on two or more of the measured magnetic field components along with one or more corresponding sensor positions or sensor calibration parameters, and (ii) generate, and transmit to the one or more magnetic field sources, the corresponding control signals, based at least in part on the estimated transverse position of the one or more primary electric discharges along with one or more corresponding source positions or source calibration parameters, so that the resulting applied magnetic fields control or alter the estimated position of the electric discharge according to a selected discharge transverse trajectory or a selected discharge transverse distribution.

Example 2. The apparatus of Example 1 wherein the estimated transverse position of the one or more primary electric discharges includes an estimated transverse position of a centroid of a total current density of the one or more primary electric discharges.

Example 3. The apparatus of Example 1 wherein the estimated transverse position of the one or more primary electric discharges includes a corresponding estimated transverse position of each one of multiple primary electric discharges.

Example 4. The apparatus of any one of Examples 1 through 3 wherein the selected discharge transverse trajectory includes a raster pattern, one or more circular paths, one or more elliptical paths, a spiral path, one or more linear paths, or an irregular path.

Example 5. The apparatus of any one of Examples 1 through 4 wherein the selected discharge distribution can include a substantially uniform distribution, a gaussian distribution, a flat-topped gaussian distribution, or a doughnut distribution.

Example 6. The apparatus of any one of Examples 1 through 5 wherein the apparatus includes two or more of the magnetic field sources that are arranged so that the corresponding applied magnetic fields have corresponding non-zero components directed transversely across at least a portion of the current-containing volume that includes the discharge gap, and the corresponding non-zero transverse magnetic field components are not parallel to one another, thereby enabling controlling or altering the estimated position of the electric discharge in two transverse dimensions.

Example 7. The apparatus of any one of Examples 1 through 6 wherein each one of the one or more magnetic field sources is arranged so that the corresponding applied magnetic field has a substantially uniform non-zero amplitude within the discharge gap and is directed substantially transversely across the discharge gap.

Example 8. The apparatus of any one of Examples 1 through 7 wherein each one of the one or more magnetic field sources comprises a corresponding pair of conductive coils (i) arranged on opposite lateral sides of the current-containing volume with corresponding coil axes substantially collinear and directed substantially transversely, and (ii) connected to the control and acquisition system so that electric current provided by the control and acquisition system flows through the coils and generates the corresponding applied magnetic field.

Example 9. The apparatus of any one of Examples 1 through 8 wherein the discharge gap is movable longitudinally within the current-containing volume, and the one or more magnetic field sources are arranged so that the applied magnetic field has a non-zero transverse component across all portions of the current-containing volume wherein the discharge gap can be located.

Example 10. The apparatus of any one of Examples 1 through 8 wherein each one of the one or more magnetic field sources is arranged so that the corresponding applied magnetic field has only negligible amplitude in at least portions of the current-containing volume that are displaced longitudinally from the discharge gap.

Example 11. The apparatus of Example 10 wherein (i) the discharge gap is movable longitudinally within the current-containing volume, (ii) at least one of the one or more magnetic field sources is arranged so as to be moveable longitudinally with respect to the current-containing volume, and (iii) the control and acquisition system is structured, programmed, and connected so as to effect longitudinal movement of the at least one moveable magnetic field source in response to longitudinal movement of the discharge gap.

Example 12. The apparatus of Example 10 wherein (i) the discharge gap is movable longitudinally within the current-containing volume, (ii) a corresponding longitudinal position along the current-containing volume of at least one of the one or more magnetic field sources differs from a corresponding longitudinal position along the current-containing volume of at least one other of the one or more magnetic field sources, and (iii) the control and acquisition system is structured, programmed, and connected so as to effect selective activation or deactivation of each one of the one or more magnetic field sources in response to longitudinal movement of the discharge gap.

Example 13. The apparatus of any one of Examples 1 through 12 wherein (i) the discharge gap is movable longitudinally within the current-containing volume, (ii) at least one of the one or more magnetic sensors is arranged so as to be moveable longitudinally with respect to the current-containing volume, and (iii) the control and acquisition system is structured, programmed, and connected so as to effect longitudinal movement of the at least one moveable magnetic field sensor in response to longitudinal movement of the discharge gap or the at least one moveable magnetic field source.

Example 14. The apparatus of any one of Examples 1 through 13 wherein the control and acquisition system is structured, programmed, and connected so as to update the one or more source calibration parameters for at least one of the one or more magnetic field sources, based at least in part on one or more previously transmitted control signals and the estimated transverse position of the electric discharge resulting from the corresponding magnetic fields applied as a result of those previously transmitted control signals.

Example 15. The apparatus of Example 14 wherein (i) the discharge gap is movable longitudinally within the current-containing volume, (ii) updating the one or more source calibration parameters includes modifying or replacing one or more calibration parameters to account for observed longitudinal movement of the discharge gap.

Example 16. The apparatus of any one of Examples 14 or 15 wherein updating the one or more source calibration parameters includes modifying or replacing one or more calibration parameters to account for an observed reversal of direction of movement of the estimated position of the electric discharge with respect to directions of the applied magnetic fields.

Example 17. The apparatus of any one of Examples 14 through 16 wherein (i) the source calibration parameters include a table of previously estimated positions of the electric discharge as a function of corresponding control signals previously transmitted to the one or more magnetic field sources, and (ii) updating the one or more source calibration parameters includes updating the table to include a currently estimated position, corresponding to a given value or range of control signals, upon observing a significant deviation between the currently estimated position and a previously estimated position corresponding to that given value or range of control signals.

Example 18. The apparatus of any one of Examples 14 through 16 wherein (i) the source calibration parameters include one or more corresponding feedback coefficients for controlling the one or more magnetic field sources in response to the estimated position of the electric discharge, and (ii) updating the one or more source calibration parameters includes updating the one or more corresponding feedback coefficients.

Example 19. The apparatus of Example 18 wherein the control and acquisition system is structured, programmed, and connected so as to update the feedback coefficient in response to a currently estimated position of the electric discharge and a corresponding currently transmitted control signal.

Example 20. The apparatus of any one of Examples 18 or 19 wherein (i) each corresponding control signal includes a superposed oscillatory dither signal, and (ii) the control and acquisition system is structured, programmed, and connected so as to detect an oscillatory component of one or more of the magnetic field components measured by one or more of the magnetic field sensors and calculate therefrom a corresponding updated feedback coefficient.

Example 21. The apparatus of any one of Examples 18 through 20 wherein one or more of the updated feedback coefficients has a sign opposite that of a corresponding previous feedback coefficient.

Example 22. The apparatus of any one of Examples 1 through 21 wherein the apparatus includes two or more of the magnetic field sensors, and the sensor positions are arranged among two or more distinct longitudinal positions along the current-containing volume or among two or more distinct circumferential positions around the lateral periphery of the current-containing volume.

Example 23. The apparatus of any one of Examples 1 through 22 wherein the apparatus includes two or more of the magnetic field sensors, and the sensor positions are arranged among two or more distinct longitudinal positions along the current-containing volume and among two or more distinct circumferential positions around the lateral periphery of the current-containing volume.

Example 24. The apparatus of any one of Examples 1 through 23 wherein each sensor is arranged so as to measure magnetic field components in two substantially transverse spatial dimensions or in three spatial dimensions.

Example 25. The apparatus of any one of Examples 1 through 24 wherein (i) the discharge gap is movable longitudinally within the current-containing volume, and (ii) the sensor calibration parameters vary according to longitudinal movement of the discharge gap.

Example 26. The apparatus of any one of Examples 1 through 25 wherein calculating the estimated position of the electric discharge includes corrections for magnetic field components arising from (i) external conductors carrying the primary electric current into the current-containing volume or carrying a return current out of the current-containing volume, (ii) external magnetic fields in which the current-carrying volume is immersed, (iii) the magnetic fields applied by the one or more magnetic field sources, or (iv) external conductors (if any) carrying electric current to the sources.

Example 27. The apparatus of any one of Examples 1 through 26 wherein the current-containing volume is enclosed within a chamber that defines the lateral periphery of the current-containing volume, and the sensor and source positions are located outside the chamber.

Example 28. The apparatus of Example 27 further comprising the chamber, wherein the chamber comprises an electric arc furnace, the first conductor comprises an electrode of the furnace, the second conductor comprises an ingot formed within the furnace, and the furnace is arranged so that the discharge gap moves longitudinally through the furnace as the primary electric current flows during a melt period, causing the electrode to melt and shrink and the ingot to grow.

Example 29. The apparatus of Example 28 wherein the control and acquisition system is structured, programmed, and connected so as to calculate an estimated discharge gap longitudinal position that changes with melt time as the primary electric current flows during the melt period.

Example 30. A method for using the apparatus of any one of Examples 1 through 29 to control or alter the estimated transverse position of the one or more primary electric discharges within the discharge gap between the first and second longitudinal electrical conductors, the method comprising: (A) using the one or more magnetic field sensors, measuring corresponding magnetic field components in two or more spatial dimensions at each corresponding sensor position; (B) using the computer system, calculating the estimated transverse position of the one or more primary electric discharges within the discharge gap; (C) using the computer system, generating, and transmitting to the one or more magnetic field sources, the corresponding control signals; and (D) using the one or more magnetic field sources, applying the corresponding applied magnetic fields in response to the corresponding control signals, thereby controlling or altering the estimated transverse position of the one or more primary electric discharges.

Example 31. The method of Example 30 further comprising (E) using the computer system, updating the one or more source calibration parameters for at least one of the one or more magnetic field sources, based at least in part on one or more previously transmitted control signals and the estimated transverse position of the electric discharge resulting from the corresponding magnetic fields applied as a result of those previously transmitted control signals.

Example 32. The method of any one of Examples 30 or 31 wherein: (E) the current-containing volume is enclosed within an electric arc furnace that defines the lateral periphery of the current-containing volume, and the sensor and source positions are located outside the furnace; (F) the first conductor comprises an electrode of the furnace, the second conductor comprises an ingot formed within the furnace, and the furnace is arranged so that the discharge gap moves longitudinally through the furnace as the primary electrical current flows during a melt period, causing the electrode to melt and shrink and the ingot to grow; and (G) parts (A) through (D) are performed during the melt period.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore the present disclosure shall be construed as implicitly disclosing any embodiment having any suitable set of one or more features—which features are shown, described, or claimed in the present application—including those sets that may not be explicitly disclosed herein. A "suitable" set of features includes only features that are neither incompatible nor mutually exclusive with respect to any other feature of the set. Accordingly, the appended claims are hereby incorporated into the Detailed Description, with each claim standing on its own as a separate disclosed embodiment. In addition, only for purposes of disclosure by said incorporation of the claims into the Detailed Description, each of the appended dependent claims shall be interpreted as if written in multiple dependent form and dependent upon all preceding claims with which it is not inconsistent. It should be further noted that the scope of the appended claims can, but does not necessarily, encompass the whole of the subject matter disclosed in the present application.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An apparatus comprising one or more magnetic field sensors, one or more magnetic field sources, and a control and data acquisition system that includes a computer system, wherein:
   (a) the one or more magnetic field sensors are arranged about a lateral periphery of a current-containing volume through which a primary electric current flows in a predominantly longitudinal direction (i) through at least portions of first and second longitudinal electrical conductors, which are positioned end-to-end within the current-containing volume and are separated by a discharge gap, and (ii) as one or more primary electric discharges spanning the discharge gap and movable in two transverse dimensions within the discharge gap between the first and second conductors;
   (b) each one of the one or more magnetic field sensors is (i) operatively coupled to the control and acquisition system, (ii) positioned at a corresponding sensor position arranged about the lateral periphery of the current-containing volume, (iii) characterized by one or more corresponding sensor calibration parameters, and (iv) arranged so as to measure magnetic field components in two or more spatial dimensions;
   (c) each one of the one or more magnetic field sources is (i) operatively coupled to the control and acquisition system, (ii) positioned at a corresponding source position arranged about the lateral periphery of the current-containing volume, (iii) characterized by one or more source calibration parameters, and (iv) arranged so as to apply, in response to a corresponding control signal, a corresponding applied magnetic field having a corresponding non-zero component directed transversely across at least a portion of the current-containing volume that includes the discharge gap; and
   (d) the computer system comprises one or more electronic processors and one or more digital storage media coupled thereto, and is structured, connected, and programmed so as to (i) calculate an estimated transverse position of the one or more primary electric discharges within the discharge gap, that calculation being based at least in part on two or more of the measured magnetic field components along with one or more corresponding sensor positions or sensor calibration parameters, and (ii) generate, and transmit to the one or more magnetic field sources, the corresponding control signals, based at least in part on the estimated transverse position of the one or more primary electric discharges along with one or more corresponding source positions or source calibration parameters, so that the resulting applied magnetic fields control or alter the estimated position of the electric discharge according to a selected discharge transverse trajectory or a selected discharge transverse distribution.

2. The apparatus of claim 1 wherein the estimated transverse position of the one or more primary electric discharges includes an estimated transverse position of a centroid of a total current density of the one or more primary electric discharges.

3. The apparatus of claim 1 wherein the estimated transverse position of the one or more primary electric discharges includes a corresponding estimated transverse position of each one of multiple primary electric discharges.

4. The apparatus of claim 1 wherein the selected discharge transverse trajectory includes a raster pattern, one or more circular paths, one or more elliptical paths, a spiral path, one or more linear paths, or an irregular path.

5. The apparatus of claim 1 wherein the selected discharge distribution can include a substantially uniform distribution, a gaussian distribution, a flat-topped gaussian distribution, or a doughnut distribution.

6. The apparatus of claim 1 wherein the apparatus includes two or more of the magnetic field sources that are arranged so that the corresponding applied magnetic fields have corresponding non-zero components directed transversely across at least a portion of the current-containing volume that includes the discharge gap, and the corresponding non-zero transverse magnetic field components are not parallel to one another, thereby enabling controlling or altering the estimated position of the electric discharge in two transverse dimensions.

7. The apparatus of claim 1 wherein each one of the one or more magnetic field sources is arranged so that the corresponding applied magnetic field has a substantially uniform non-zero amplitude within the discharge gap and is directed substantially transversely across the discharge gap.

8. The apparatus of claim 1 wherein each one of the one or more magnetic field sources comprises a corresponding pair of conductive coils (i) arranged on opposite lateral sides of the current-containing volume with corresponding coil axes substantially collinear and directed substantially transversely, and (ii) connected to the control and acquisition system so that electric current provided by the control and acquisition system flows through the coils and generates the corresponding applied magnetic field.

9. The apparatus of claim 1 wherein the discharge gap is movable longitudinally within the current-containing volume, and the one or more magnetic field sources are arranged so that applied magnetic field has a non-zero transverse component across all portions of the current-containing volume wherein the discharge gap can be located.

10. The apparatus of claim 1 wherein each one of the one or more magnetic field sources is arranged so that the corresponding applied magnetic field has only negligible amplitude in at least portions of the current-containing volume that are displaced longitudinally from the discharge gap.

11. The apparatus of claim 10 wherein (i) the discharge gap is movable longitudinally within the current-containing volume, (ii) at least one of the one or more magnetic field sources is arranged so as to be moveable longitudinally with respect to the current-containing volume, and (iii) the control and acquisition system is structured, programmed, and connected so as to effect longitudinal movement of the at least one moveable magnetic field source in response to longitudinal movement of the discharge gap.

12. The apparatus of claim 10 wherein (i) the discharge gap is movable longitudinally within the current-containing volume, (ii) a corresponding longitudinal position along the current-containing volume of at least one of the one or more magnetic field sources differs from a corresponding longitudinal position along the current-containing volume of at least one other of the one or more magnetic field sources, and (iii) the control and acquisition system is structured, programmed, and connected so as to effect selective activation or deactivation of each one of the one or more magnetic field sources in response to longitudinal movement of the discharge gap.

13. The apparatus of claim 1 wherein (i) the discharge gap is movable longitudinally within the current-containing volume, (ii) at least one of the one or more magnetic sensors is arranged so as to be moveable longitudinally with respect to the current-containing volume, and (iii) the control and acquisition system is structured, programmed, and connected so as to effect longitudinal movement of the at least one moveable magnetic field sensor in response to longitudinal movement of the discharge gap or the at least one moveable magnetic field source.

14. The apparatus of claim 1 wherein the control and acquisition system is structured, programmed, and connected so as to update the one or more source calibration parameters for at least one of the one or more magnetic field sources, based at least in part on one or more previously transmitted control signals and the estimated transverse position of the electric discharge resulting from the corresponding magnetic fields applied as a result of those previously transmitted control signals.

15. The apparatus of claim 14 wherein (i) the discharge gap is movable longitudinally within the current-containing volume, (ii) updating the one or more source calibration parameters includes modifying or replacing one or more calibration parameters to account for observed longitudinal movement of the discharge gap.

16. The apparatus of claim 14 wherein updating the one or more source calibration parameters includes modifying or replacing one or more calibration parameters to account for an observed reversal of direction of movement of the estimated position of the electric discharge with respect to directions of the applied magnetic fields.

17. The apparatus of claim 14 wherein (i) the source calibration parameters include a table of previously estimated positions of the electric discharge as a function of corresponding control signals previously transmitted to the one or more magnetic field sources, and (ii) updating the one or more source calibration parameters includes updating the table to include a currently estimated position, corresponding to a given value or range of control signals, upon observing a significant deviation between the currently estimated position and a previously estimated position corresponding to that given value or range of control signals.

18. The apparatus of claim 14 wherein (i) the source calibration parameters include one or more corresponding feedback coefficients for controlling the one or more magnetic field sources in response to the estimated position of the electric discharge, and (ii) updating the one or more source calibration parameters includes updating the one or more corresponding feedback coefficients.

19. The apparatus of claim 18 wherein the control and acquisition system is structured, programmed, and connected so as to update the feedback coefficient in response to a currently estimated position of the electric discharge and a corresponding currently transmitted control signal.

20. The apparatus of claim 18 wherein (i) each corresponding control signal includes a superposed oscillatory dither signal, and (ii) the control and acquisition system is structured, programmed, and connected so as to detect an oscillatory component of one or more of the magnetic field components measured by one or more of the magnetic field sensors and calculate therefrom a corresponding updated feedback coefficient.

21. The apparatus of claim 18 wherein one or more of the updated feedback coefficients has a sign opposite that of a corresponding previous feedback coefficient.

22. The apparatus of claim 1 wherein the apparatus includes two or more of the magnetic field sensors, and the sensor positions are arranged among two or more distinct longitudinal positions along the current-containing volume or among two or more distinct circumferential positions around the lateral periphery of the current-containing volume.

23. The apparatus of claim 1 wherein the apparatus includes two or more of the magnetic field sensors, and the sensor positions are arranged among two or more distinct longitudinal positions along the current-containing volume and among two or more distinct circumferential positions around the lateral periphery of the current-containing volume.

24. The apparatus of claim 1 wherein each sensor is arranged so as to measure magnetic field components in two substantially transverse spatial dimensions or in three spatial dimensions.

25. The apparatus of claim 1 wherein (i) the discharge gap is movable longitudinally within the current-containing volume, and (ii) the sensor calibration parameters vary according to longitudinal movement of the discharge gap.

26. The apparatus of claim 1 wherein calculating the estimated position of the electric discharge includes corrections for magnetic field components arising from (i) external conductors carrying the primary electric current into the current-containing volume or carrying a return current out of the current-containing volume, (ii) external magnetic fields in which the current-carrying volume is immersed, (iii) the magnetic fields applied by the one or more magnetic field sources, or (iv) external conductors (if any) carrying electric current to the sources.

27. The apparatus of claim 1 wherein the current-containing volume is enclosed within a chamber that defines the lateral periphery of the current-containing volume, and the sensor and source positions are located outside the chamber.

28. The apparatus of claim 27 further comprising the chamber, wherein the chamber comprises an electric arc furnace, the first conductor comprises an electrode of the furnace, the second conductor comprises an ingot formed within the furnace, and the furnace is arranged so that the discharge gap moves longitudinally through the furnace as the primary electric current flows during a melt period, causing the electrode to melt and shrink and the ingot to grow.

29. The apparatus of claim 28 wherein the control and acquisition system is structured, programmed, and connected so as to calculate an estimated discharge gap longitudinal position that changes with melt time as the primary electric current flows during the melt period.

30. A method for using the apparatus of claim 1 to control or alter the estimated transverse position of the one or more primary electric discharges within the discharge gap between the first and second longitudinal electrical conductors, the method comprising:
  (A) using the one or more magnetic field sensors, measuring corresponding magnetic field components in two or more spatial dimensions at each corresponding sensor position;
  (B) using the computer system, calculating the estimated transverse position of the one or more primary electric discharges within the discharge gap;
  (C) using the computer system, generating, and transmitting to the one or more magnetic field sources, the corresponding control signals; and
  (D) using the one or more magnetic field sources, applying the corresponding applied magnetic fields in response to the corresponding control signals, thereby controlling or altering the estimated transverse position of the one or more primary electric discharges.

31. The method of claim 30 further comprising (E) using the computer system, updating the one or more source calibration parameters for at least one of the one or more magnetic field sources, based at least in part on one or more previously transmitted control signals and the estimated transverse position of the electric discharge resulting from the corresponding magnetic fields applied as a result of those previously transmitted control signals.

32. The method of claim 30 wherein:
(E) the current-containing volume is enclosed within an electric arc furnace that defines the lateral periphery of the current-containing volume, and the sensor and source positions are located outside the furnace;
(F) the first conductor comprises an electrode of the furnace, the second conductor comprises an ingot formed within the furnace, and the furnace is arranged so that the discharge gap moves longitudinally through the furnace as the primary electrical current flows during a melt period, causing the electrode to melt and shrink and the ingot to grow; and
(G) parts (A) through (D) are performed during the melt period.

\* \* \* \* \*

UNITED STATES PATENT AND TRADEMARK OFFICE
CERTIFICATE OF CORRECTION

PATENT NO. : 10,761,116 B2
APPLICATION NO. : 16/209943
DATED : September 1, 2020
INVENTOR(S) : Cibula et al.

It is certified that error appears in the above-identified patent and that said Letters Patent is hereby corrected as shown below:

In the Specification

At Column 1 Line 18, please insert the following new section heading and new paragraph before the subject heading "FIELD OF THE INVENTION":
--STATEMENT REGARDING FEDERALLY SPONSORED RESEARCH OR DEVELOPMENT
This invention was made with government support under Project 1647655 awarded by the National Science Foundation. The government has certain rights in the invention.--.

In the Claims

At Column 22 Line 62 (Claim 13), please replace "claim 1" with --claim 10--.

At Column 22 Line 64 (Claim 13), please insert --field-- between "magnetic" and "sensors".

Signed and Sealed this
Seventh Day of June, 2022

Katherine Kelly Vidal
*Director of the United States Patent and Trademark Office*